United States Patent
Kang et al.

(10) Patent No.: US 10,893,346 B2
(45) Date of Patent: Jan. 12, 2021

(54) DISPLAY APPARATUS

(71) Applicant: LG Display Co., Ltd., Seoul (KR)

(72) Inventors: Taecheol Kang, Bucheon-si (KR); Moonyoung Shin, Bucheon-si (KR); YeongRak Choi, Bucheon-si (KR); Sungsu Ham, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/044,970

(22) Filed: Jul. 25, 2018

(65) Prior Publication Data

US 2019/0200111 A1 Jun. 27, 2019

(30) Foreign Application Priority Data

Dec. 26, 2017 (KR) .................. 10-2017-0180010

(51) Int. Cl.
| | |
|---|---|
| *H04R 1/02* | (2006.01) |
| *G02F 1/1333* | (2006.01) |
| *H01L 27/32* | (2006.01) |
| *H04R 7/04* | (2006.01) |
| *H01L 51/52* | (2006.01) |
| *H04R 11/02* | (2006.01) |

(52) U.S. Cl.
CPC ....... *H04R 1/028* (2013.01); *G02F 1/133308* (2013.01); *H01L 27/3225* (2013.01); *H04R 7/045* (2013.01); *H01L 27/3244* (2013.01); *H01L 51/524* (2013.01); *H01L 51/5237* (2013.01); *H04R 11/02* (2013.01); *H04R 2499/15* (2013.01)

(58) Field of Classification Search
CPC ................ H04R 1/028; H04R 2499/15; H04R 2499/11; H04R 7/045; H04R 1/02; H04R 1/2807; H04R 11/02; G02F 1/133308; H01L 27/3244; H01L 51/5237; H04M 1/0266
USPC ...... 381/303–306, 71.7, 333, 334, 151, 152, 381/339, 345, 162, 365, 191
See application file for complete search history.

(56) References Cited

U.S. PATENT DOCUMENTS

| | | | |
|---|---|---|---|
| 2005/0099361 A1* | 5/2005 | Majer | .................. G06F 1/1616 345/1.3 |
| 2006/0140438 A1* | 6/2006 | Kimura | .................. H04M 1/03 381/431 |

(Continued)

FOREIGN PATENT DOCUMENTS

| | | |
|---|---|---|
| CN | 1921095 A | 2/2007 |
| CN | 103299654 A | 9/2013 |

(Continued)

OTHER PUBLICATIONS

First Notification of Office Action dated May 8, 2020, issued in corresponding Chinese Patent Application No. 201810895973.4.

*Primary Examiner* — Norman Yu
(74) *Attorney, Agent, or Firm* — Morgan, Lewis & Bockius LLP

(57) ABSTRACT

A display apparatus includes: a display panel configured to display an image, one or more sound generation devices configured to vibrate the display panel to generate sound, a supporting member configured to support the display panel, a partition between the display panel and the supporting member, the partition including: a first side in a horizontal direction, and a second side in a vertical direction, and one or more first pad parts on the first side.

34 Claims, 21 Drawing Sheets

(56) References Cited

U.S. PATENT DOCUMENTS

| | | | |
|---|---|---|---|
| 2006/0227981 A1* | 10/2006 | Miyata | G02F 1/133 |
| | | | 381/124 |
| 2007/0045841 A1 | 3/2007 | Cho et al. | |
| 2012/0038570 A1* | 2/2012 | Delaporte | G06F 1/1616 |
| | | | 345/173 |
| 2013/0279730 A1 | 10/2013 | Tanaka | |
| 2014/0160040 A1 | 6/2014 | Kang et al. | |
| 2014/0334078 A1 | 11/2014 | Lee et al. | |
| 2015/0185963 A1 | 7/2015 | Lee et al. | |
| 2015/0350775 A1* | 12/2015 | Behles | H04R 3/002 |
| | | | 381/354 |
| 2017/0280216 A1 | 9/2017 | Lee et al. | |
| 2017/0280243 A1 | 9/2017 | Choi et al. | |

FOREIGN PATENT DOCUMENTS

| | | | |
|---|---|---|---|
| CN | 103869523 A | 6/2014 | |
| CN | 104143292 A | 11/2014 | |
| CN | 104751743 A | 7/2015 | |

\* cited by examiner

DISPLAY APPARATUS

CROSS-REFERENCE TO RELATED APPLICATION(S)

This application claims the benefit of and priority to Korean Patent Application No. 10,2017/018,001.0, filed on Dec. 26, 2017, the entirety of which is hereby incorporated by reference.

BACKGROUND

1. Technical Field

The present disclosure relates to a display apparatus, and in particular, to a display apparatus for vibrating a display panel to generate sound.

2. Discussion of the Related Art

With the advancement of an information-oriented society, various desires for the display field of expressing information in accordance with an electric information signal are increasing. Thus, research is being conducted on various display apparatuses that are thin, light, and have low power consumption. For example, the display apparatuses may be categorized into a liquid crystal display (LCD) apparatus, a field emission display (FED) apparatus, an organic light-emitting display (OLED) apparatus, etc.

Among the above display apparatuses, the LCD apparatus may include an array substrate including a thin film transistor (TFT), an upper substrate including a color filter and/or black matrix, and a liquid crystal layer interposed between the array substrate and the upper substrate. An alignment state of the liquid crystal layer is controlled based on an electric field applied to two electrodes of a pixel region, whereby light transmittance is adjusted based on the alignment state of the liquid crystal layer, to thereby display an image. The OLED apparatus, which is a self-light-emitting display device, has advantages of low power consumption, fast response speed, high light-emitting efficiency, high luminance, and wide viewing angle.

A display apparatus displays an image on a display panel, and an additional speaker for supplying sound generally has to be provided. If the speaker is provided in the display apparatus, the sound generated in the speaker advances toward a lower or rear portion of the display panel instead of a front portion of the display panel. Thus, the sound does not advance toward the front portion of the display panel, i.e., toward a user who watches the image displayed on the display panel, so that it disrupts a user's immersion experience. In addition, as the sound generated in the speaker advances toward the lower or rear portion of the display panel, sound quality is deteriorated due to an interference with sound reflected on the wall or floor. Furthermore, if the speaker is included in a set apparatus, such as television, laptop computer, or computer monitor, the speaker occupies a space that may impose a restriction on design and a spatial disposition of the set apparatus.

SUMMARY

Accordingly, the present disclosure is directed to a display apparatus that substantially obviates one or more of the issues due to limitations and disadvantages of the related art.

Therefore, the inventors have recognized the above-described problems and have conducted various experiments so that, when watching an image in front of a display panel, a traveling direction of a sound becomes a direction toward a front surface of the display panel. Thus, sound quality is enhanced. Through the various experiments, the inventors have invented a display apparatus having a new structure, which facilitates to output sound so that a traveling direction of a sound becomes a direction toward a front direction of a display panel, thereby enhancing sound quality.

An aspect of the present disclosure is to provide a display apparatus including a sound generation device capable of outputting sound to a front direction of a display panel.

Another aspect of the present disclosure is to provide a sound generation device having a new structure for decreasing a wave phenomenon.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided a display apparatus, including: a display panel configured to display an image, one or more sound generation devices configured to vibrate the display panel to generate sound, a supporting member configured to support the display panel, a partition between the display panel and the supporting member, the partition including: a first side in a horizontal direction, and a second side in a vertical direction, and one or more first pad parts on the first side.

In another aspect, there is provided a display apparatus, including: a display panel configured to display an image, the display panel including a first region, a second region, and a third region, one or more sound generation devices in at least one of: the first region, the second region, and the third region, a supporting member configured to support the display panel, a first partition between the display panel and the supporting member, the first partition including: a first side in a horizontal direction, and a second side in a vertical direction, and one or more first pad parts on the first side.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1A:
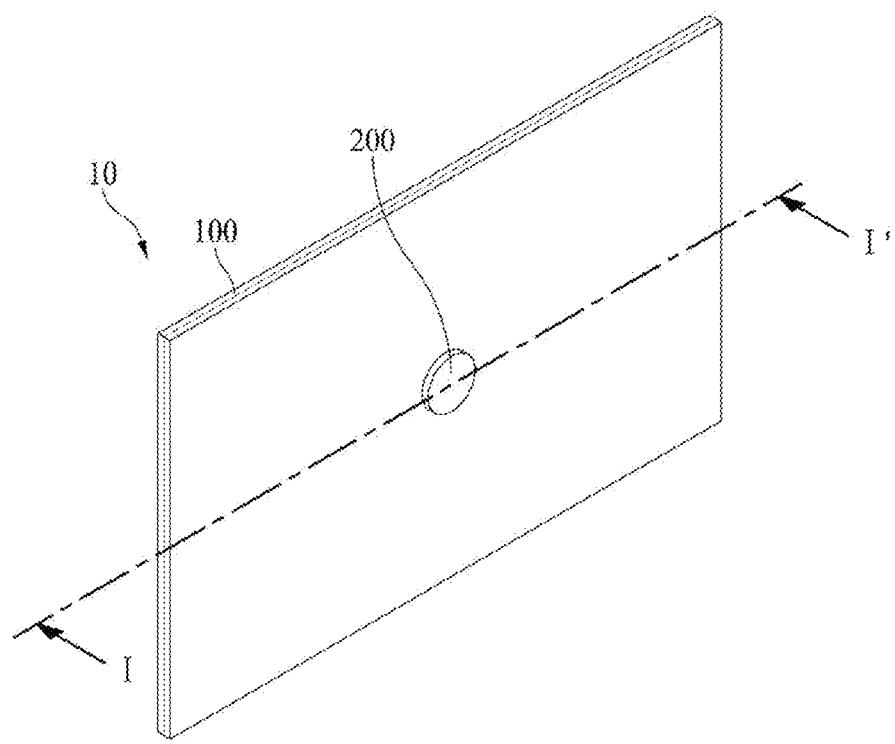
FIG. 1A illustrates a display apparatus including a sound generation device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

In the present disclosure, the term "display apparatus" is used to encompass a display apparatus, such as a liquid crystal display module (LCM) or an organic light-emitting display module (OLED module), that includes a display panel and a driving unit for driving the display panel. Further, the term "display apparatus" according to an embodiment of the present disclosure is used to further encompass a set device (or a set apparatus) or a set electronic apparatus, as a finished product, such as a notebook computer or a laptop computer, a television set, a computer monitor, an equipment apparatus (e.g., display equipment in an automotive apparatus or another type of vehicle apparatus) or a mobile electronic apparatus that is a complete product or a final product (for example a smart phone or electronic pad. etc.) that includes the LCM, the OLED module, or the like. Accordingly, in the present disclosure, the term "display apparatus" is used both as a display apparatus itself, such as the LCM and the OLED modules, and also as a set apparatus that is a final consumer apparatus or an application product including the LCM or the OLED module.

In addition, in some examples, the LCM and the OLED module, including a display panel and a driving unit thereof, may be referred to as a "display apparatus" in a particular sense, and the electronic apparatus as the final product including the LCM and OLED module may be alternatively referred to as a "set apparatus" or a "set device." For example, the display apparatus in a particular sense may include a display panel, such as a liquid crystal display (LCD) panel or an organic light-emitting display (OLED) panel, and a source printed circuit board (PCB) as a controller for driving the same. The set apparatus may further include a set PCB that is a controller set to be electrically connected to the source PCB and to control the overall operations of the set device or the set apparatus.

The display panel used for an embodiment of the present disclosure may be any type of display panel, for example, a liquid crystal display panel, an organic light-emitting diode display panel, an electroluminescent display panel, etc., but embodiments are not limited to these types. For example, the display panel may be any panel capable of generating sound in accordance with a vibration by a sound generation device. Moreover, a shape or size of a display panel applied to a display apparatus according to an embodiment is not limited.

An example liquid crystal display panel may include a plurality of gate lines, a plurality of data lines, and a plurality of pixels respectively provided in a plurality of pixel areas defined by intersections of the gate lines and the data lines. Further, the liquid crystal display panel may include an array substrate including a thin film transistor (TFT) corresponding to a switching device for controlling a light transmittance of each of the plurality of pixels, an upper substrate including a color filter and/or black matrix, and a liquid crystal layer formed between the array substrate and the upper substrate.

An example organic light-emitting display panel may include a plurality of gate lines, a plurality of data lines, and a plurality of pixels in intersections of the gate lines and the data lines. In addition, the organic light-emitting display panel may include an array substrate including a thin film transistor (TFT) corresponding to a element for selectively applying a voltage to each pixel, an organic light-emitting device layer on the array substrate, and an encapsulation substrate disposed on the array substrate to cover the organic light-emitting device layer. The encapsulation substrate may protect the TFT and the organic light-emitting device layer from an external impact, and may reduce or prevent moisture or oxygen from penetrating into the organic light-emitting device layer. Furthermore, the organic light-emitting device layer provided on the array substrate may include an inorganic light-emitting layer, for example, nano-sized material layer or quantum dot material layer. As another example, the display panel may include a micro light-emitting diode.

The display panel may further include a backing, such as a metal plate, attached to a rear surface of the display panel. However, embodiments are not limited to the metal plate, and other structures may be provided.

The display panel including the sound generation device according to an embodiment of the present disclosure may be implemented at a user interface module in a vehicle, such as the central control panel area in an automobile. For example, such a display panel may be configured between two front seat occupants such that sounds due to vibrations of the display panel propagate towards the interior of the vehicle. As such, the audio experience within a vehicle can be improved as compared to having speakers only at the interior sides or edges of the vehicle.

Hereinafter, a display apparatus according to embodiments of the present disclosure will be described in detail with reference to the accompanying drawings.

FIG. 1A illustrates a display apparatus including a sound generation device according to an embodiment of the present disclosure.

FIG. 1A illustrates a rear surface of a display apparatus 10. With reference to FIG. 1A, the display apparatus 10 may include a display panel 100 for displaying an image, and a sound generation device 200. The sound generation device 200 may vibrate the display panel 100 to generate sound. The sound generation device 200 may be on the rear surface of the display panel 100.

The display panel 100 may display an image, e.g., an electronic or digital image, and may be implemented as all types of display panels, such as a liquid crystal display panel, an organic light emitting diode (OLED) display panel, an electroluminescent display panel, etc. The display panel 100 may vibrate, based on a vibration of the sound generation device 200, to output a sound.

According to an embodiment, the display panel 100 may display an image in a type such as a top-emission type, a bottom-emission type, or a dual-emission type, based on a structure of a pixel array layer, including an anode electrode, a cathode electrode, and an organic compound layer. In the top-emission type, visible light emitted from the pixel array layer may be irradiated onto a region in front of a base substrate to allow an image to be displayed. In the bottom-emission type, the visible light emitted from the pixel array layer may be irradiated onto a region behind the base substrate to allow an image to be displayed.

And, the sound generation device 200 may generate a sound by using the display panel 100 as a vibration plate. The sound generation device 200 may be referred to as an "actuator", an "exciter," or a "transducer", but embodiments are not limited thereto. For example, the sound generation device 200 may be a sound device for outputting a sound according an electrical signal.

Figure 1B:
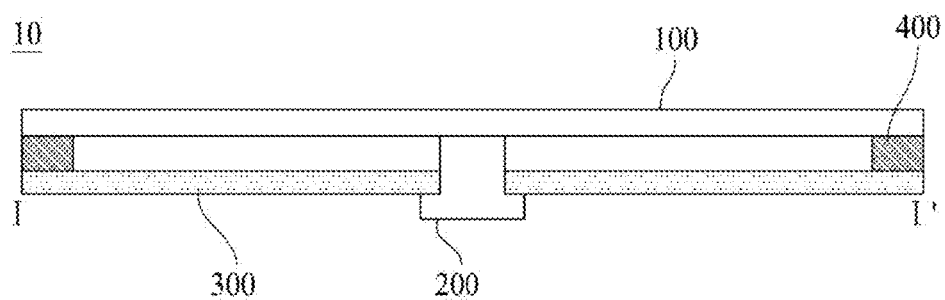
FIG. 1B is a cross-sectional view taken along line I-I' of FIG. 1A.

FIG. 1B is a cross-sectional view taken along line I-I' of FIG. 1A.

With reference to FIG. 1B, the display apparatus may include the sound generation device 200 and a supporting member 300. The supporting member 300 may support at least one of rear surface and a side (or lateral) surface of the display panel 100. The sound generation device 200 may be fixed to the supporting member 300.

As an example, the supporting member 300 may be a cover bottom. For example, the supporting member 300 may include a middle cabinet provided to surround a lateral surface or a side surface of the display panel 100, connected with the cover bottom, and provided to accommodate one periphery of the display panel 100 to support the display panel 100. For example, the middle cabinet may have a "ㅓ"-shaped cross section. The supporting member 300 may include the cover bottom, or may include the cover bottom and the middle cabinet, but embodiments are not limited to these example structures. The supporting member 300 may include any structure capable of supporting the rear surface or lateral surface of the display panel 100.

The supporting member 300 may be a plate-shaped member formed over a rear surface or entire surface of the display panel 100. For example, the supporting member 300 may cover the whole rear surface of the display panel 100 to be spaced apart from the rear surface. The supporting member 300 may have a plate shape formed of, e.g., a glass material, a metal material, or a plastic material. For example, a periphery or a sharp corner of the supporting member 300 may have a tetragonal (e.g., rectangular or square) shape having a sloping surface or a curved shape, e.g., through a chamfer process or a corner rounding process. According to an embodiment, the supporting member 300 including a glass material may include sapphire glass. For example, the supporting member 300 including the metal material may be formed of one or more of: aluminum (Al), an Al alloy, a magnesium (Mg) alloy, and an iron (Fe)-nickel (Ni) alloy. As another example, the supporting member 300 may have a stacked structure including a glass plate, which may have a thickness relatively thinner than a metal plate and a glass plate, and may face the rear surface of the display panel 100. In one example, a rear surface of the display apparatus may be used as a mirror surface, e.g., due to the metal plate. However, embodiments are not limited to these example materials and shapes.

And, the supporting member 300 may include a through hole into which the sound generation device 200 may be inserted. For example, the through hole may be bored in a particular partial region of the supporting member 300 along a thickness direction of the supporting member 300 to have, e.g., a circular shape or a polygonal shape, such that the sound generation device 200 may be inserted in the through hole.

The supporting member 300 may be referred to as a "cover bottom," a "plate bottom," a "back cover," a "base frame," a "metal frame," a "metal chassis," a "chassis base," or an "m-chassis." Thus, the supporting member 300 may be embodied in all types of frame or plate-shaped structure that may be used as a supporter for supporting the display panel 100, and may be disposed at the rear surface of the display apparatus.

In addition, an adhesive member 400 may be disposed in the periphery of the supporting member 300 and the display panel 100. The adhesive member 400 may be provided to adhere the display panel 100 and the supporting member 300 to each other, and the adhesive member 400 may include a double-sided tape, a single-sided tape, an adhesive, a bond, and/or the like, but embodiments are not limited thereto.

Figure 2A:
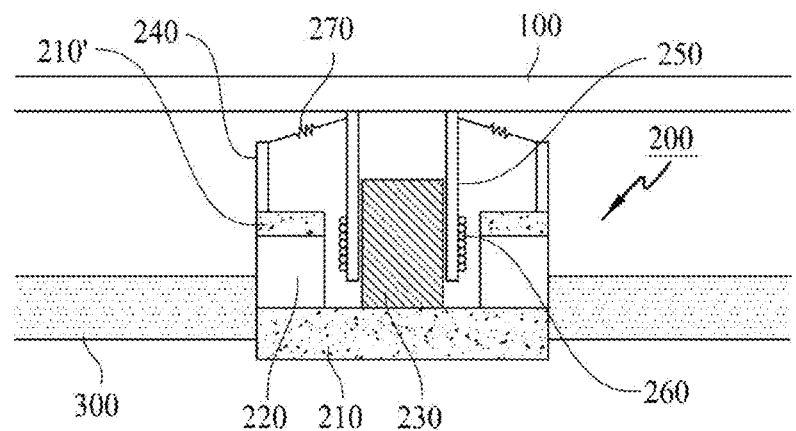
FIGS. 2A and 2B are cross-sectional views illustrating the sound generation device according to an embodiment of the present disclosure.
Figure 2B:
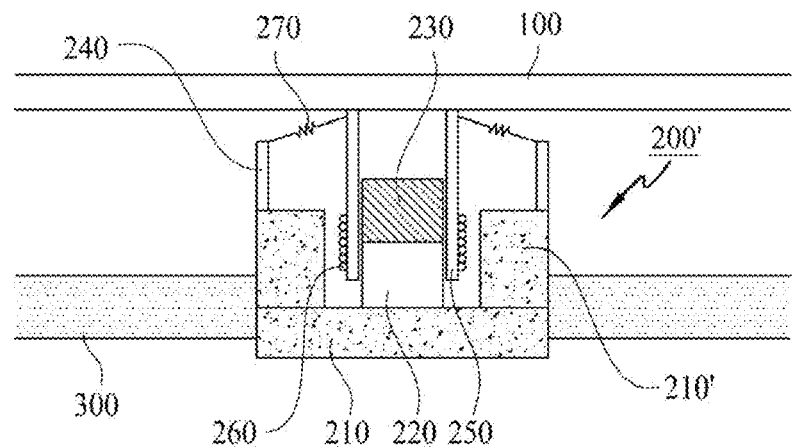

FIGS. 2A and 2B are cross-sectional views illustrating the sound generation device according to an embodiment of the present disclosure.

The sound generation device may be classified as a first structure corresponding to an external magnetic type in which a magnet is disposed outside a coil, and a second structure corresponding to an internal magnetic type in which a magnet is disposed inside a coil. The first structure may be expressed as a "dynamic type" or "external magnetic type," and the second structure may be expressed as a "micro type" or "internal magnetic type." FIG. 2A illustrates the first structure, and FIG. 2B illustrates the second structure.

FIG. 2A illustrates the first structure in which a magnet is disposed outside a coil. With reference to FIG. 2A, the sound generation device 200 may include a plurality of plates 210 and 210', a magnet 220 on the plate 210, a center pole 230 on the plate 210, a bobbin 250 near the center pole 230, and a coil 260 wound on an outer surface of the bobbin 250. For example, the magnet 220 may be on the first plate 210, and the second plate 210' may be on the magnet 220. The first plate 210 and the second plate 210' may support the magnet 220, and may fix the sound generation device 200 to the supporting member 300. Accordingly, the first plate 210 may be fixed to a supporting hole of the supporting member 300, and the magnet 220 may be fixed and supported between the first plate 210 and the second plate 210'.

At least one of the first plate 210 and the second plate 210' may be formed of a magnetic material, such as iron (Fe). The first plate 210 and the second plate 210' are not limited to the term "plate." For example, they may be referred to another term, such as a "yoke."

The magnet 220 may be implemented, e.g., with a sintered magnet, with a material such as barium ferrite, and a material of the magnet 220 may include one or more of: ferric oxide ($Fe_2O_3$); barium carbonate (or witherite) ($BaCO_3$); neodymium (Nd); strontium ferrite ($Fe_{12}O_{19}Sr$), e.g., with an improved magnet component; and an alloy cast magnet including aluminum (Al), nickel (Ni), cobalt (Co), and/or the like. As another example, the neodymium magnet may be neodymium-iron-boron (Nd—Fe—B). However, embodiments are not limited to these examples.

A frame 240 may be on the second plate 210' along the periphery of the first plate 210. The center pole 230 may be in a center region of the first plate 210. The center pole 230 and the first plate 210 may be formed as one body. The center pole 230 may be referred to as "pole pieces." In one example, pole pieces may be additionally disposed on the center pole 230.

The bobbin 250 may surround the center pole 230. The coil 260 may be wound on a lower outer area, for example, a lower outer surface of the bobbin 250, and a current or a voice signal for generating sound may be applied to the coil 260. The bobbin 250 may be a ring-shaped structure, e.g., of paper, and aluminum (Al) sheet, and/or the like. The coil 260 may be wound around a certain area of the lower portion of the bobbin 250. The bobbin 250 and the coil 260 may be referred to as a "voice coil." A damper 270 may be disposed between some area of an upper portion of the bobbin 250 and the frame 240. The damper 270 may be expressed by another term, such as an "edge."

FIG. 2B illustrates the second structure in which a magnet is disposed inside a coil. With reference to FIG. 2B, the sound generation device 200' of the second structure may include a magnet 220 on a first plate 210, a center pole 230 on the magnet 220, a bobbin 250 disposed around the magnet 220 and the center pole 230, and a coil 260 wound on an outer surface of the bobbin 250.

For example, the first plate 210 may be fixed to a supporting hole of the supporting member 300. The magnet 220 may be on the first plate 210, and the center pole 230 may be on the magnet 220. The center pole 230 may be referred to as "pole pieces." In one example, pole pieces may be additionally provided on the center pole 230. The bobbin 250 may surround the magnet 220 and the center pole 230, and the coil 260 may be wound on the outer surface of the bobbin 250.

A second plate 210' may be on the outer periphery of the first plate 210, and a frame 240 may be outside the periphery of the second plate 210'. For example, a damper 270 may be disposed between the frame 240 and the bobbin 250.

In comparison to the first structure in which the magnet is disposed outside the coil, the second structure having the internal magnet has advantages of small leakage magnetic flux and decreased total size of the sound generation device. The sound generation device used for the display apparatus according to an embodiment of the present disclosure is not limited to the structures of the FIGS. 2A and 2B. It is possible to use any sound generation device capable of generating the sound by vibrating, e.g., directly vibrating, the display panel.

Figure 3A:
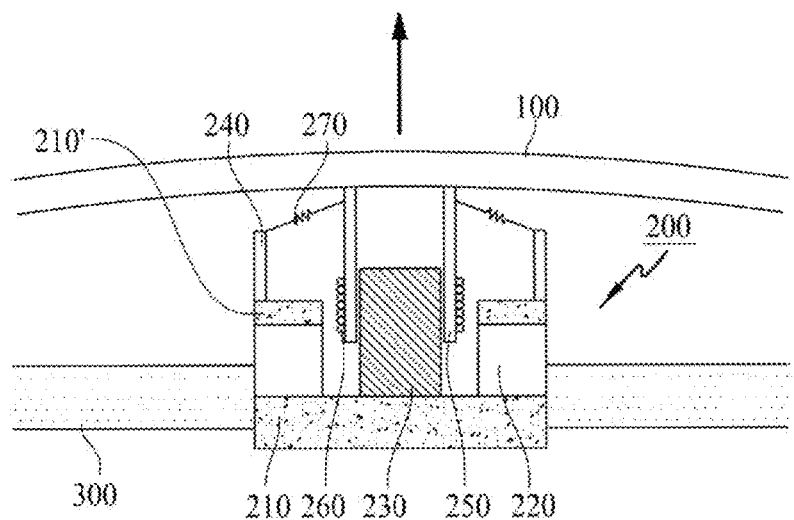
FIGS. 3A and 3B illustrate a sound-generating method of the sound generation device with a first structure according to an embodiment of the present disclosure.
Figure 3B:
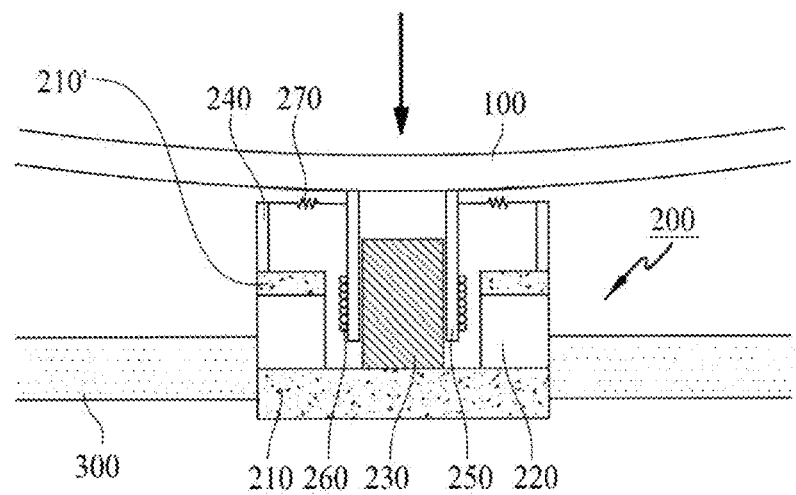

FIGS. 3A and 3B illustrate a sound-generating method of the sound generation device with a first structure according to an embodiment of the present disclosure.

FIG. 3A shows a state in which a current is applied. The center pole 230 connected to a lower surface of the magnet 220 becomes a north (N) pole, and the second plate 210' connected to an upper surface of the magnet 220 becomes a south (S) pole. Thus, an external magnetic field may be generated around the coil 260.

In this state, if the current for generating sound is applied to the coil 260, an applied magnetic field is formed around the coil 260, whereby a force for upwardly moving the bobbin 250 may be generated by the applied magnetic field and the external magnetic field. For example, when the current is applied to the coil 260, the magnetic field may be generated around the coil 260, and the external magnetic field may be generated by the magnet 220, whereby the entire bobbin 250 may be guided and moved upwardly by the center pole 230 based on Fleming's Left-Hand Rule for Motors.

Accordingly, as one surface of the bobbin 250 may contact a rear surface of the display panel 100, the bobbin may vibrate the display panel 100 in an upward direction (illustrated as an arrow) according to whether or not the current is applied to the coil 260, and sound wave (or sound) is generated by the vibration of the display panel 100. In this state, when the current stops or a reverse current is applied, as shown in FIG. 3B, a force for downwardly moving the bobbin 250 may be generated, similar to the principle described with reference to FIG. 3A, and the display panel 100 may vibrate in a downward direction (illustrated as an arrow).

The damper 270 may be disposed between the frame 240 and some portion of the upper portion of the bobbin 250. The damper 270 may have a wrinkled structure, e.g., having elasticity, and the damper 270 may control (or dampen) the up-and-down vibration of the bobbin 250 by contraction and relaxation movements in accordance with the up-and-down movement of the bobbin 250. That is, the damper 270 may be connected to the bobbin 250 and the frame 240, and the up-and-down vibration of the bobbin 250 may be controlled by a restoring force of the damper 270. For example, if the bobbin 250 vibrates to be higher or lower than a particular height, the bobbin 250 may be restored to its original position by the restoring force of the damper 270. Therefore, the display panel 100 may vertically vibrate based on an application direction and level of a current applied to the coil 260, and a sound wave may be generated by the vibration.

Figure 4A:
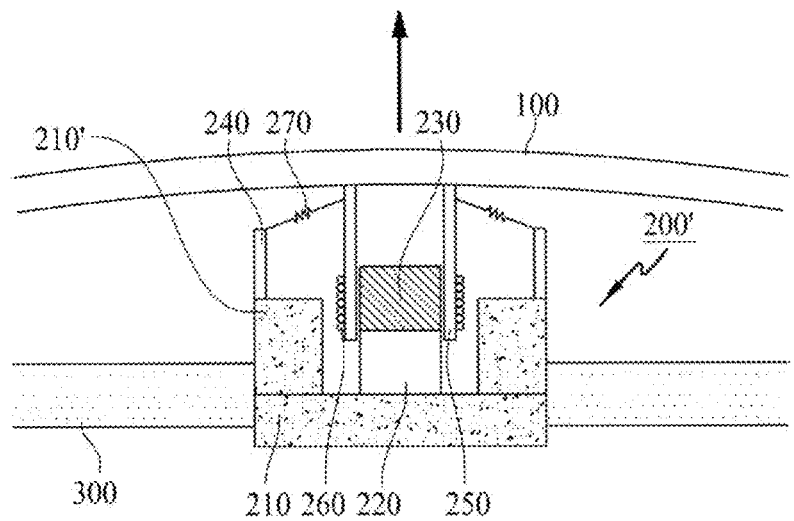
FIGS. 4A and 4B illustrate a sound-generating method of the sound generation device with a second structure according to an embodiment of the present disclosure.
Figure 4B:
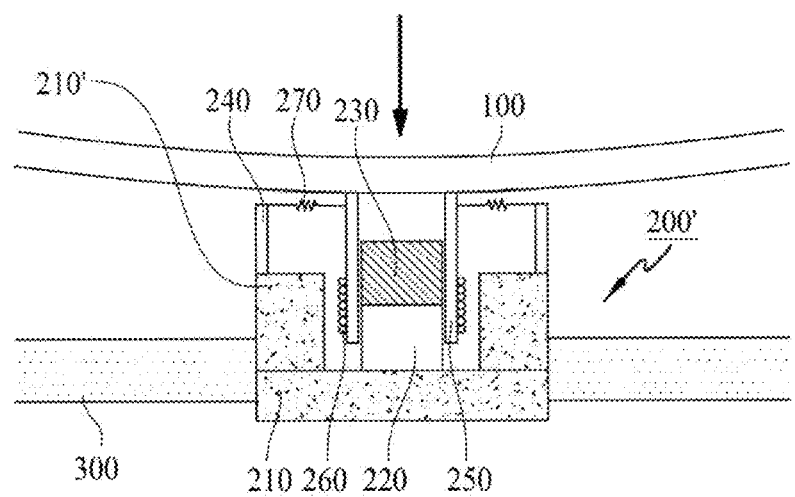

FIGS. 4A and 4B illustrate a sound-generating method of the sound generation device with a second structure according to an embodiment of the present disclosure.

FIG. 4A shows a state in which a current is applied. The second plate 210' becomes the S pole, and the center pole 230 connected with an upper surface of the magnet 220 becomes the N pole, whereby an external magnetic field may be generated around the coil 260. The S-pole and the N-pole may be interchanged; if so, the sound generation device may identically operate by changing a winding direction of the coil 260. In this state, when the current for generating sound is applied to the coil 260, an applied magnetic field may be formed around the coil 260, whereby a force for upwardly moving the bobbin 250 may be generated by the applied magnetic field and the external magnetic field. For example, when the current is applied to the coil 260, the magnetic field may be generated around the coil 260, and the external magnetic field may be generated by the magnet 220, whereby the entire bobbin 250 may be guided and moved upwardly by the center pole 230 based on Fleming's Left-Hand Rule for Motors.

Accordingly, as one surface of the bobbin 250 is in contact with the rear surface of the display panel 100, thus, the bobbin 250 may vibrate the display panel 100 in an upward direction (illustrated as an arrow) according to whether or not the current is applied to the coil 260, and sound wave (or sound) may be generated by the vibration of the display panel 100. In this state, when the current stops or a reverse current is applied, as shown in FIG. 4B, a force for downwardly moving the bobbin 250 may be generated according to principles similar to the above description with reference FIG. 4A, whereby the display panel 100 may be vibrated in a downward direction (illustrated as an arrow).

The damper 270 may be disposed between the frame 240 and some portion of the upper portion of the bobbin 250. The damper 270 may have a wrinkled structure having elasticity, whereby the damper 270 may control the up-and-down vibration of the bobbin 250 by contraction and relaxation movements in accordance with the up-and-down movement of the bobbin 250. That is, the damper 270 may be connected with the bobbin 250 and the frame 240, and the up-and-down vibration of the bobbin 250 may be controlled (or dampened) by a restoring force of the damper 270. For example, if the bobbin 250 vibrates to be higher or lower than a particular height, the bobbin 250 may be restored to its original position by the restoring force of the damper 270. Accordingly, the display panel 100 may be vibrated in the up-and-down direction in accordance with the direction and level of the current applied to the coil 260, to thereby generate a sound wave by the vibration.

Figure 5A:
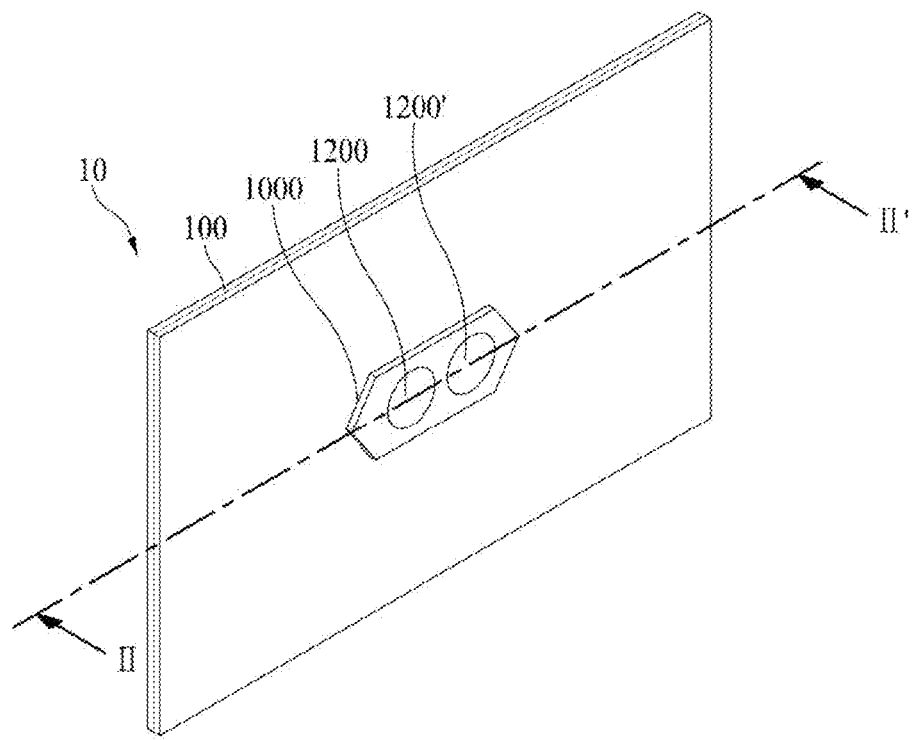
FIG. 5A illustrates a sound generation device according to an embodiment of the present disclosure.
Figure 5B:
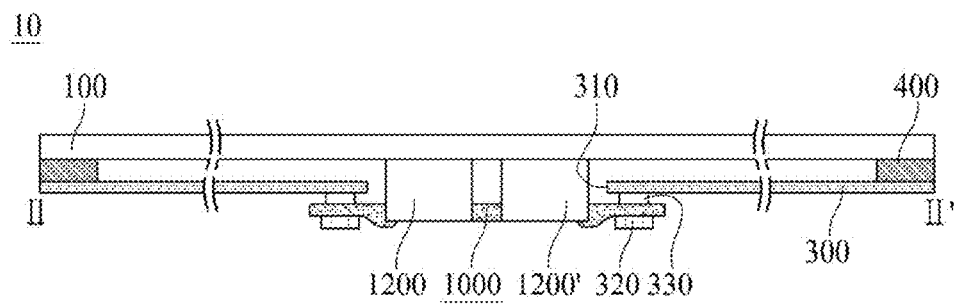
FIG. 5B is a cross-sectional view taken along line II-II' of FIG. 5A.

FIG. 5A illustrates a sound generation device according to an embodiment of the present disclosure. FIG. 5B is a cross-sectional view taken along line II-II' of FIG. 5A.

With reference to FIG. 5A, a display apparatus may include a display panel 100, and first and second sound generation devices 1200 and 1200' for generating sound by vibrating the display panel 100. The first sound generation device 1200 and the second sound generation device 1200' may be adjacent to each other. If the plurality of sound generation devices are spaced apart from each other, it may be difficult to maintain a contact characteristic between the sound generation device and the display panel, which may cause deterioration of sound quality by interference or delay phenomenon of the sound wave generated in the sound generation devices. Thus, in comparison to a structure in which the plurality of sound generation devices are spaced apart from each other, a structure according to an embodiment in which the sound generation devices are adjacent to each other may reduce an interference or delay phenomenon of the sound wave generated in the sound generation devices, to thereby improve the sound output characteristics.

The first structure or the second structure described above with reference to FIGS. 2A and 2B may be applied to a structure of each of the first sound generation device 1200 and the second sound generation device 1200'. For example, the display apparatus may include a fixing device 1000 for fixing the first sound generation device 1200 and the second sound generation device 1200'. The fixing device 1000 may be a mold structure manufactured by a molding process, e.g., using a plastic material, but embodiments are not limited thereto. The fixing device 1000 will be described below with reference to FIG. 6.

With reference to FIG. 5B, the display apparatus may include the first sound generation device 1200, the second sound generation device 1200', and a supporting member 300. The supporting member 300 may support at least one of rear and side surfaces of the display panel 100. The supporting member 300 may be a plate-shaped member, e.g., of a metal or plastic material, over a rear surface or an entire surface of the display panel 100.

The sound generation device 1200 and 1200' may be accommodated in a supporting hole 310 of the supporting member 300. If the sound generation device 1200 and 1200' is inserted into and fixed to the supporting hole 310, it is possible to decrease or reduce a height of the sound generation device 1200 and 1200' disposed between the rear surface of the display panel 100 and an inner surface of the supporting member 300, to thereby realize a relatively small space or area for generating the sound.

For example, the display apparatus may include a nut 330 fixed to the supporting member 300. The fixing device 1000 may be fixed to the nut 330 by the use of screw 320 inserted into a mounting hole of the fixing device 1000. For example, a screw through-hole may be provided in an inner surface the nut 330. Thus, after a mounting hole of the fixing device 1000 is aligned with the screw through-hole of the nut 330, the fixing device 1000 may be fixed to the supporting member 300 by fastening (or tightening) the screw 320.

In one example, the nut 330 may be a self-clinching nut. An example of the self-clinching nut may be a PEM® nut, although embodiments are not limited thereto. If the self-clinching nut is used, some of the vibration generated in the sound generation device 1200 may be absorbed by the self-clinching nut. Thus, a vibration transferred to the supporting member 300 may be reduced.

In the display apparatus according to an embodiment of the present disclosure, the supporting member 300 and the sound generation device 1200 may be fixed to each other by the use of nut and screw included in the supporting member 300. Thus, a thickness of the display panel 100 can be reduced. Further, an adhesive member 400 may be disposed in a periphery of the supporting member 300 and the display panel 100, to thereby adhere the display panel 100 and the supporting member 300 to each other. The adhesive member 400 may include a double-sided tape, a single-sided tape, an adhesive, a bond, and/or the like, but embodiments are not limited thereto.

Figure 6:
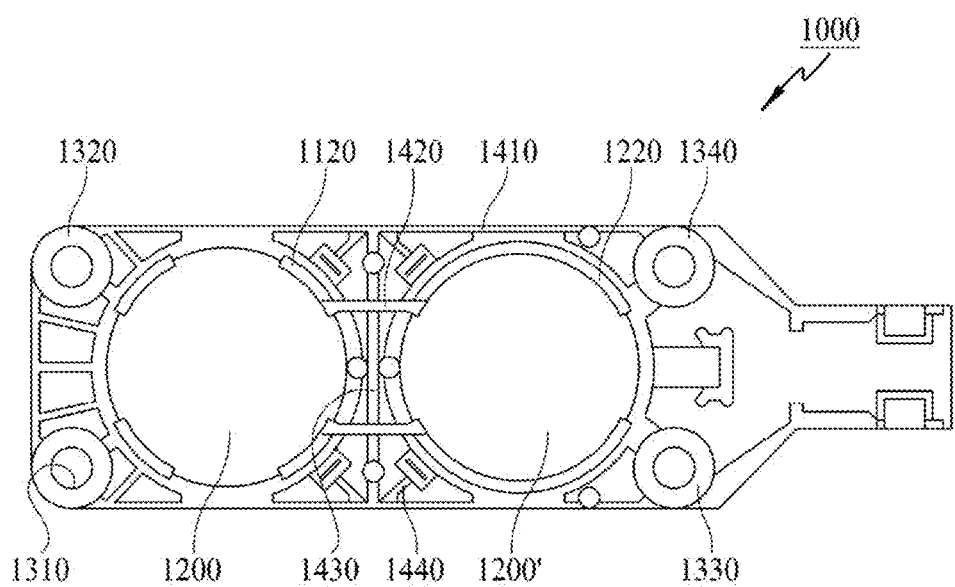
FIG. 6 illustrates a fixing device of the sound generation device according to an embodiment of the present disclosure.

FIG. 6 illustrates a fixing device of the sound generation device according to an embodiment of the present disclosure.

With reference to FIG. 6, the fixing device 1000 of the sound generation device may be an integrated fixing device for supporting and fixing the first sound generation device 1200 and the second sound generation device 1200' to be adjacent to each other. Thus, the first sound generation device 1200 and the second sound generation device 1200' fixed using the fixing device 1000 may be a pair of sound generation devices, which will be referred to as a "pair of sound generation devices." The fixing device 1000 of the sound generation device may include a supporting part for supporting the sound generation devices 1200 and 1200', a plurality of rib parts disposed near the sound generation devices 1200 and 1200', and a plurality of mounting holes for fixing the fixing device 1000 to the supporting member 300.

For example, the supporting part may include a first supporting part 1120 for supporting the first sound generation device 1200, and a second supporting part 1220 for supporting the second sound generation device 1200'. The first supporting part 1120 may support a portion of a lateral surface and a portion of a rear surface of the first sound generation device 1200. The first supporting part 1120 may have a cylinder shape, but embodiments are not limited thereto. The second supporting part 1220 may support a portion of a lateral surface and a portion of a rear surface of the second sound generation device 1200'. The second supporting part 1220 may have a cylinder shape, but embodiments are not limited thereto.

For example, the first supporting part 1120 and the second supporting part 1220 may further include protrusions having two or four arc-shaped protrusions. One surface of each of the protrusions may be bent toward an inner portion of each sound generation device 1200 and 1200', and may support a portion of a rear surface of each sound generation device 1200 and 1200', thereby avoiding or preventing the sound generation device 1200 and 1200' from being separated from the outside of the fixing device 1000. For example, a plurality of rib parts may be near the first supporting part 1120 and the second supporting part 1220, thereby maintaining a rigidity of the fixing device 1000, and reducing or preventing a deformation of the fixing device 1000 of the sound generation device, even when being used for a long time.

The plurality of rib parts may include a first rib part 1410 extending in a widthwise (or horizontal) direction from an outer portion of the first supporting part 1120 and the second supporting part 1220 in a horizontal direction, a second rib part 1420 for connecting the first supporting part 1120 and the second supporting part 1220 with each other in the widthwise (or horizontal) direction, and a third rib part 1430 connected with the first rib part 1410 in a lengthwise (or vertical) direction. As used herein, the terms "widthwise direction" or "horizontal direction" refer to a direction of a long side along which a pair of sound generation devices is disposed, and may be used interchangeably. As used herein, the terms "lengthwise direction" or "vertical direction" refer to a direction perpendicular to the widthwise (or horizontal) direction, and may be used interchangeably. In addition, the widthwise (or horizontal) direction may be referred to as a "landscape" direction of the display panel, and the lengthwise (or vertical) direction may be referred to as a "portrait" direction of the display panel.

The first rib part 1410 may extend from the outer surface of the first supporting part 1120 and the second supporting part 1220 in the horizontal direction, to thereby form a horizontal-direction outer structure of the fixing device 1000 of the sound generation device. A central area of the first rib part 1410, that is, the central area between the first supporting part 1120 and the second supporting part 1220, may be relatively higher or thicker than both side areas of the first rib part 1410. Accordingly, even when two sound generation devices are vibrated for a long time, the fixing device 1000 of the two sound generation devices may not be deformed, and a change in the relative position between the two sound generation devices and the display panel may be reduced.

One or more second rib parts 1420 may be disposed where the first supporting part 1120 and the second supporting part 1220 are connected to each other as one body. The one or more second rib parts 1420 may be disposed inside the first rib part 1410. In the FIG. 6 example, two of the second rib parts 1420 are illustrated, but embodiments are not limited thereto. For example, one, three, or more of the second rib part 1420 may be provided.

One or more third rib parts 1430 may be connected to the first and second rib parts 1410 and 1420 as one body. The one or more third rib parts 1430 may extend in the widthwise direction, and may be provided between two second rib parts 1420 or between two first rib parts 1410.

In the FIG. 6 example, one third rib part 1430 is illustrated, and the third rib part 1430 extends in the lengthwise direction between two of the first rib parts 1410, but embodiments are not limited thereto. For example, the third rib part 1430 may extend in a shorter distance between two of the second rib parts 1420.

The rib parts may further include one or more of a fourth rib part 1440 between the first supporting part 1120 and the first rib part 1410, or between the second supporting part 1220 and the first rib part 1410. The fourth rib part 1440 may be obliquely extended. The fourth rib part 1440 may avoid or prevent the fixing device 1000 of the sound generation device from being bent, e.g., during a long-time driving of the sound generation device.

Accordingly, the display apparatus according to an embodiment may include the fixing device for fixing the pair of sound generation devices and the plurality of rib parts near the sound generation devices. Therefore, the rigidity of the sound generation devices may be maintained, and a sound characteristic change caused by a long-time operation may be reduced.

A distance between the first supporting part 1120 and the second supporting part 1220 may be larger than a minimum threshold value that enables formation of the rib part, and may be smaller than a maximum threshold value corresponding to a diameter of the first sound generation device 1200 and the second sound generation device 1200'. If the distance between the first supporting part 1120 and the second supporting part 1220 is greater than the minimum threshold value, the sound quality may be reduced. Therefore, the distance between the first supporting part 1120 and the second supporting part 1220 may be smaller than the diameter of the first sound generation device 1200 and/or the second sound generation device 1200', to thereby reduce or prevent deterioration of the sound quality. For example, if the sound generation device has size (e.g., diameter) 'D', the distance between the first supporting part 1120 and the second supporting part 1220 may be a value larger than about 7 mm, corresponding to an example minimum threshold value, and may be smaller than the size 'D' of the sound generation device. In one example, the change in sound quality characteristics is not greater when the size 'D' of the sound generation device is about 28 mm, then if the distance is about (0.85*D) (e.g., about 23.6 mm).

A plurality of mounting holes 1310, 1320, 1330, and 1340 may be included for fixing the fixing device 1000 and the supporting member 300 to each other. The screw through-hole may be formed in the inner surface of the nut 330, as shown in the example of FIG. 5B. Thus, after aligning the mounting holes 1310, 1320, 1330, and 1340 of the fixing device 1000 and the screw through-hole of the nut 330, the screw 320 may be fastened (or tightened) so that the fixing device 1000 may be fixed to the supporting member 300.

If, according to an embodiment of the present disclosure, a pair of sound generation devices is applied, a uniform sound pressure may be generated in the entire frequency range, e.g., a whole frequency band, thereby realizing good sound output characteristics.

Figure 7:
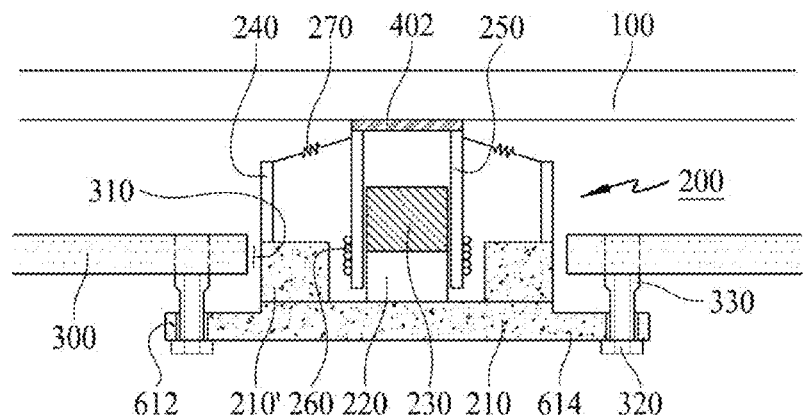
FIG. 7 illustrates a connection structure of a supporting member and a sound generation device according to an embodiment of the present disclosure.

FIG. 7 illustrates a connection structure of a supporting member and a sound generation device according to an embodiment of the present disclosure.

An embodiment of the present disclosure may be applied to both first and second structures of the sound generation device. Hereinafter, an example of the second structure of the sound generation device will be described in detail.

With reference to FIG. 7, the sound generation device 200 may include a diameter enlargement part 614. The diameter enlargement part 614 may be formed as one body with the first plate 210 of the sound generation device 200. The first plate 210 of the sound generation device 200 may not have a cylindrical shape. Herein, one portion of the first plate 210 may have a protrusion portion larger than a diameter of the other portion of the first plate 210. The protrusion portion having an enlarged diameter may be referred to as the diameter enlargement part 614. The diameter enlargement part 614 may have a ring shape. An extension portion 612 for fixation of the sound generation device 200 may be formed in a portion of the diameter enlargement part 614.

In the extension portion 612, there may be a screw 320 and a nut 330. By the use of nut 330 fixed to the supporting member 300, the sound generation device 200 may be connected with the supporting member 300 by the screw 320. For example, the nut 330 may be a self-clinching nut. One example of the self-clinching nut is a PEM® nut, but embodiments are not limited thereto. If using the self-clinching nut, some of the vibration generated in the sound generation device 1200 may be absorbed by the self-clinching nut. Thus, a vibration transferred to the supporting member 300 may be reduced. Also, the sound generation device 200 may be accommodated into a supporting hole 310 included in the supporting member 300.

The display panel 100 may be attached to the bobbin 250 of the sound generation device 200 by the use of adhesive member 402. The adhesive member 402 may be a double-sided tape, single-sided tape, adhesive, or bond, but embodiments are not limited to these examples. As shown in the FIG. 7 example, the adhesive member 402 may be provided on a particular portion where the sound generation device 200 is adhered to the display panel 100, but embodiments are not limited to this structure. The adhesive member 402 may be provided on an entire rear surface of the display panel 100. For example, the adhesive member 402 may be provided on an entire surface between the display panel 100 and the sound generation device 200.

Figure 8:
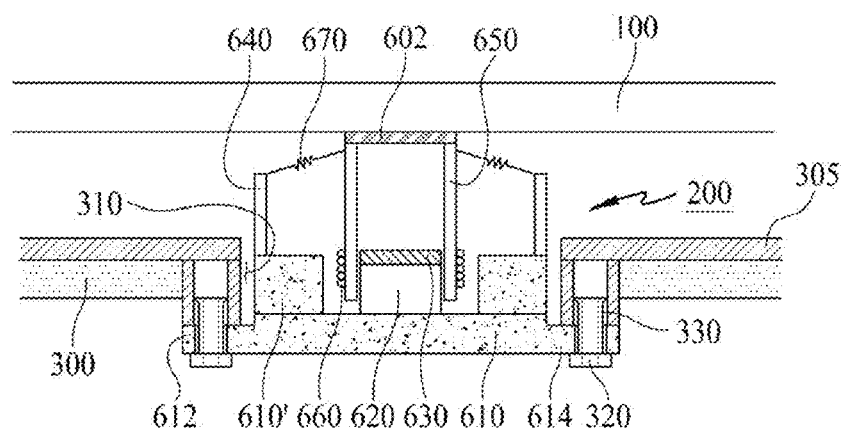
FIG. 8 illustrates a connection structure of a supporting member and a sound generation device according to an embodiment of the present disclosure.

FIG. 8 illustrates a connection structure of a supporting member and a sound generation device according to an embodiment of the present disclosure.

An embodiment of the present disclosure may be applied to both first and second structures of the sound generation device. Hereinafter, an example of the second structure of the sound generation device will be described in detail.

With reference to FIG. 8, the sound generation device 200 may include a magnet 620 on a first plate 610, a center pole 630 on the magnet 620, a bobbin 650 disposed around the magnet 620 and the center pole 630, and a coil 660 wound on an outer surface of the bobbin 650. For example, a second plate 610' may be on the periphery of the first plate 610, and a frame 640 may be on the periphery of the second plate 610'. Also, a damper 670 may be disposed between the frame 640 and the bobbin 650. The FIG. 8 example of the sound generation device 200 is substantially similar to that of the FIG. 2 example, and a duplicate description for the sound generation device 200 will be omitted.

The sound generation device 200 may further include a diameter enlargement part 614. The diameter enlargement part 614 may be formed as one body with the first plate 610 of the sound generation device 200. The first plate 610 of the sound generation device 200 may be a cylinder shape. Herein, one portion of the first plate 610 may have a protrusion portion larger than a diameter of the remaining area of the first plate 610. The protrusion portion with a relatively-large diameter may be referred to as the diameter enlargement part 614. The diameter enlargement part 614 may have a ring shape, and an extension portion 612 for fixation of the sound generation device 200 may be formed in a particular portion of the diameter enlargement part 614.

In the extension portion 612, there may be a screw 320 and a nut 330. For example, the nut 330 may be a self-clinching nut. One example of the self-clinching nut is a PEM® nut. The sound generation device 200 may be fixed to a supporting member 300 by the use of nut 330 and screw 320. If using the self-clinching nut to connect the supporting member 300 and the sound generation device 200 with each other, some of the vibration generated in the sound generation device 200 may be absorbed in the self-clinching nut, to reduce the vibration transferred to the supporting member 300. If the supporting member 300 and the sound generation device 200 are directly connected to each other without using the self-clinching nut, the vibration generated for an operation of the sound generation device 200 may be transferred to the supporting member 300 for a long period of time. In this case, if the supporting member 300 has a small thickness, the supporting member 300 might be bent or deformed. For example, if the supporting member 300 is thin, the sound generation device 200 may be directly coupled or connected to the screw 320 of the supporting member 300. Thus, a fixing strength between the supporting member 300 and the sound generation device 200 may be insufficient.

Accordingly, if the nut 330 is provided to fix the sound generation device 200 to the supporting member 300, it may be necessary to increase a thickness of the supporting member 300 to avoid or prevent the supporting member 300 from being bent or deformed and to improve a fixing strength between the supporting member 300 and the sound generation device 200. The increased thickness of the supporting member 300 may cause an increase in the overall thickness of the display apparatus. If the supporting member 300 is formed of glass or stainless steel for improving an aesthetic design appearance of the display apparatus, it may be impossible to insert the nut 330 into the supporting member 300.

Therefore, a second supporting member 305 may be further provided on the supporting member 300 to insert the nut 330 into the supporting member 300. The second supporting member 305 may be disposed closer to the display panel 100 than the supporting member 300.

The second supporting member 305 may be formed of, e.g., a metal material, and the nut 330 may be capable of being inserted into the second supporting member 305. By the use of the nut 330 fixed to the supporting member 300, the sound generation device 200 may be connected to the supporting member 300 and the second supporting member 305 by the screw 320. The supporting member 300 and the second supporting member 305 may be fixed and adhered to each other by the use of an adhesive member. The adhesive member may be a double-sided tape, single-sided tape, adhesive, or bond, but embodiments are not limited thereto. In one example, the second supporting member 305 may be formed of a metal material, for example, aluminum (Al), but embodiments are not limited thereto. The second supporting member 305 may be referred to as an "inner plate."

The supporting member 300 may be glass, stainless steel, and/or the like. Thus, an aesthetic design appearance of a display apparatus may be improved. Accordingly, as the second supporting member 305 may be additionally provided, the sound generation device 200 may be tightly adhered to a front surface of the display panel 100 by the thickness of the supporting member 300. Thus, the thickness of the display apparatus may be decreased. Accordingly, the additionally-provided second supporting member 305 may enable a decrease in the thickness of the sound generation device 200, thereby decreasing the thickness of the overall display apparatus. For example, the thickness of the sound generation device may be decreased by the second supporting member 305, thereby overcoming a problem related to the increased thickness or height of the supporting plate for covering the sound generation device 200. Thus, the sound generation device 200 and signal lines may be disposed under the supporting plate, thereby providing the display apparatus with the good exterior design.

An adhesive member 602 may attach the display panel 100 to the sound generation device 200. The adhesive member 602 may be a double-sided tape, single-sided tape, adhesive, bond, and/or the like, but embodiments are not limited thereto. As shown in the FIG. 8 example, the adhesive member 602 may be provided in a particular area where the sound generation device 200 is attached to the display panel 100, but embodiments are not limited to this example structure. The adhesive member 602 may be provided on an entire (or whole) rear surface of the display panel 100. For example, the adhesive member 602 may be provided on an entire (or whole) surface between the display panel 100 and the sound generation device 200.

Figure 9A:
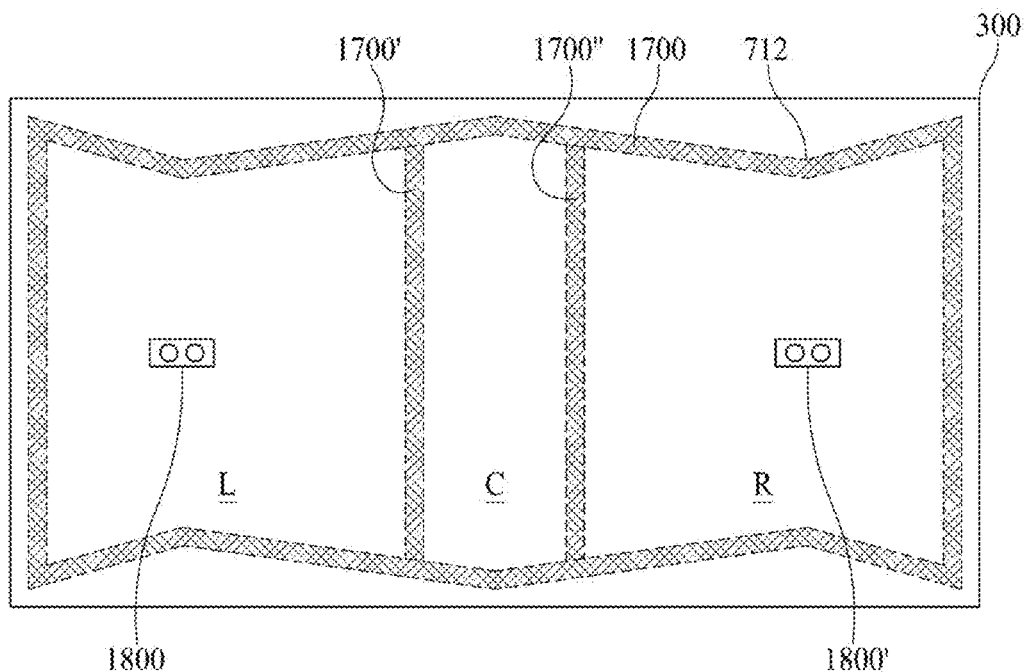
FIGS. 9A and 9B illustrate examples of a sound generation device and a partition, in a display apparatus according to an embodiment of the present disclosure.
Figure 9B:
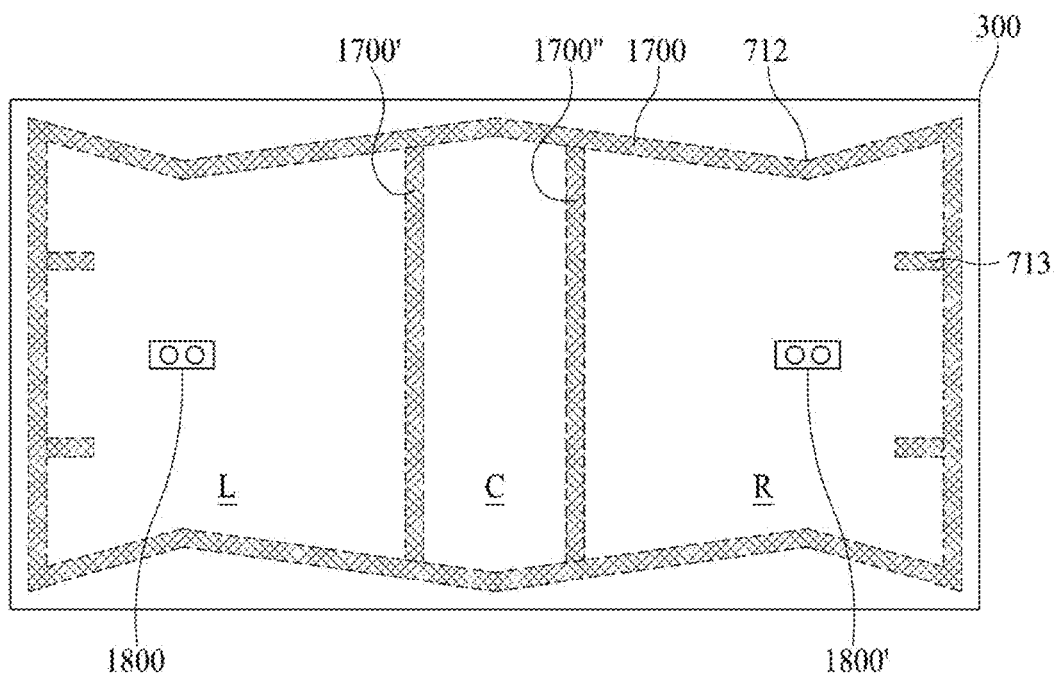

FIGS. 9A and 9B illustrate examples of a sound generation device and a partition, in a display apparatus according to an embodiment of the present disclosure.

With reference to FIGS. 9A and 9B, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. One of ordinary skill in the art would understand that the terms "left" and "right" are interchangeable throughout this disclosure, and are used only for convenience of description with reference to the illustrated drawings. A first sound generation device 1800 may be in the first region L of the rear surface of the display panel 100, and a second sound generation device 1800' may be in the second region R of the rear surface of the display panel 100.

In one example, the first sound generation device 1800 and the second sound generation device 1800' may be provided as a pair of sound generation devices. Descriptions of the pair of sound generation device are substantially similar to descriptions given above with reference to FIGS. 5 and 6, and thus, are not repeated.

A partition may be provided between the first sound generation device 1800 and the second sound generation device 1800'. The partition may be configured with a first partition 1700, a second partition 1700', and a third partition 1700". Each of the first partition 1700, the second partition 1700', and the third partition 1700" may be an air gap or a space where a sound may be generated when the display panel 100 is vibrated by the first sound generation device 1800 and the second sound generation device 1800'. Further, the second partition 1700' and the third partition 1700" may separate a left sound and a right sound, which may be generated by the first sound generation device 1800 and the second sound generation device 1800'.

A sound wave, generated when a display panel vibrates by a sound generation device, may be progressed radially from a center of the sound generation device and may travel. The sound wave may be referred to as a "progressive wave." The progressive wave may be reflected by one side of the partition to generate a reflected wave, and the reflected wave may travel in an opposite direction of the progressive wave.

The reflected wave may overlap and interfere with the progressive wave and may not travel, thereby generating a standing wave that stands at a certain position. A sound pressure may be reduced by the standing wave; thus, a sound output characteristic may be reduced. Therefore, a bent portion may be provided in the partition to decrease the phenomenon of reduction in sound pressure caused by the standing wave generated by interference between the reflected wave and the progressive wave. Also, the standing wave, which causes the sound pressure to be reduced, may be generated more at a position at which a level of the progressive wave and the reflected wave is large. Accordingly, the bent portion may be disposed at a position at which a level of a sound wave transferred from the sound generation device is largest. This will be described in detail below.

With reference to FIGS. 9A and 9B, the partition may be provided, and a bent portion may be further provided on at least one side of the partition. The first sound generation device 1800 may be in the first region L, which may be the left region of the rear surface of the display panel 100. The second sound generation device 1800' may be in the second region R, which may be the right region of the rear surface of the display panel 100. In addition, the second partition 1700' and the third partition 1700" may be disposed between the first sound generation device 1800 and the second sound generation device 1800'.

The first partition 1700 may be between the display panel 100 and a supporting member 300. For example, the first partition 1700 may be in a periphery of the supporting member 300. Also, the first partition 1700, the second partition 1700', and the third partition 1700" may be on the rear surface of the display panel 100 or on a front surface of the supporting member 300. Further, the first partition 1700 may be in the periphery of the display panel 100. For example, the first partition 1700 may be in a periphery of the rear surface of the display panel 100. With reference to FIGS. 9A and 9B, an example in which the first partition 1700 is on the supporting member 300 will be described.

A bent portion 712 may be provided on one or more sides of the first partition 1700. The bent portion 712 may be provided on one or more sides, e.g., where a strongest sound wave reaches, among four sides of the first partition 1700. The bent portion 712 may be configured to face (or extend) toward the first and second sound generation devices 1800 and 1800'. For example, the bent portion 712 may be configured to face the first and second sound generation devices 1800 and 1800'. The rear surface of the display panel 100 may include four sides, and the bent portion 712 may be provided on one or more first sides of the four sides.

Therefore, each of two sides, e.g., an upper side and a lower side, among four sides surrounding the display panel 100, may configure a bent portion 712 to have a certain inclined angle with respect to a horizontal direction (or a widthwise direction) of the display panel 100. The bent portion 712 may be configured with two straight-line portions and may be provided at a position at which the two straight-line portions contact each other. Accordingly, the degree of reduction in a sound pressure caused by a standing wave may be reduced.

With reference to FIG. 9B, the bent portion 712 and a protrusion portion or pad part 713 may be provided in the first partition 1700. For example, the bent portion 712 may be provided on one or more sides of the first partition 1700, and one or more protrusions 713 may be provided on a side perpendicular to a side on which the bent portion 712 is provided. The protrusions 713 may further decrease the degree of reduction in a sound pressure caused by the standing wave, which may occur due to interference of the reflected wave and the progressive wave.

A substrate configuring the display panel 100 may use, e.g., a glass substrate. To implement a thin display apparatus, the glass substrate may be provided to be thin. For example, by using a glass substrate having a thickness of about 0.7 mm to 0.5 mm, the display apparatus may be more thinly implemented. Because the substrate may be thin, when the partition is provided on the rear surface of the display panel 100 or the front surface of the supporting member 300, a problem may occur in which the display panel 100 is not flat and a step is formed in the display panel 100, due to the partition, when the display panel 100 is attached to the supporting member 300. For example, a problem may occur in which the display panel 100 is not flat and a screen is unevenly or roughly seen, due to a shape of the bent portion 712 bounced to or protruded from the screen of the display panel 100 or due to a separated portion of the bent portion 712, for example, a portion where the two straight-line portions contact each other. Such a phenomenon may be referred to as an "uneven" phenomenon or a "wave" phenomenon of the display panel 100 (hereinafter it is referred to wave phenomenon), but the term is not limited thereto. This will be described in detail below with reference to FIGS. 10 to 12B.

Figure 10:
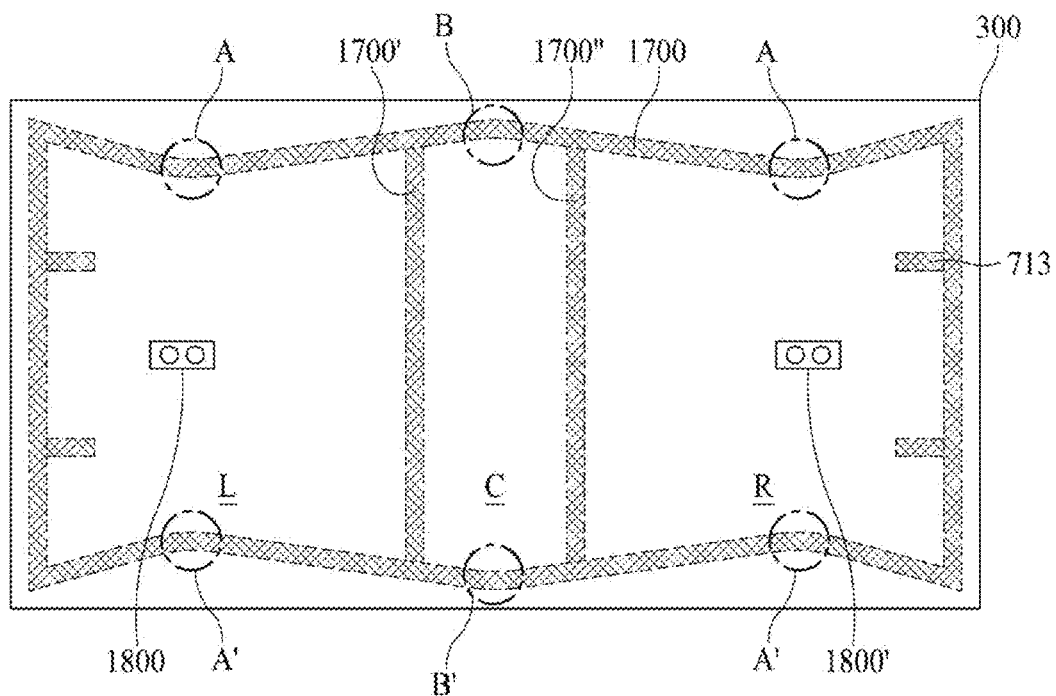
FIG. 10 illustrates an example of a sound generation device and a partition, in a display apparatus according to an embodiment of the present disclosure.

FIG. 10 illustrates an example of a sound generation device and a partition, in a display apparatus according to an embodiment of the present disclosure.

With reference to FIG. 10, a display panel according to an embodiment may be implemented by changing a shape of the bent portion 712, described above with reference to FIG. 9B, to a concave shape or a round shape. This is for solving a wave phenomenon of the display panel by changing a shape of the bent portion 712. An experimental result obtained by checking (or testing) the display panel according to an embodiment will be described below with reference to FIGS. 11 and 12.

FIGS. 11A to 12B show experimental results obtained by measuring a rear surface of a display panel, in a display apparatus according to an embodiment of the present disclosure.

Figure 11A:
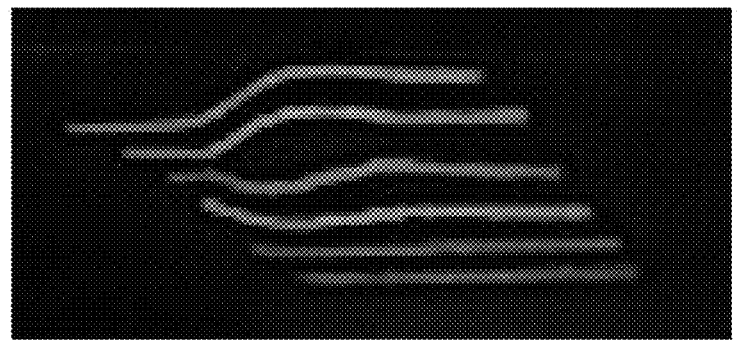
FIGS. 11A to 12B show experimental results obtained by measuring a rear surface of a display panel, in a display apparatus according to an embodiment of the present disclosure.
Figure 11B:

FIGS. 11A and 11B show results obtained by checking (or testing) a portion A and a portion A' of FIG. 10. The portion A and the portion A' may be disposed in a supporting member, e.g., the supporting member 300. The portion A may be a bent portion 712 provided in a first partition 1700 in a first region L, and the portion A' may be a bent portion 712 provided in a first partition 1700 in a second region R. FIG. 11A shows the portion A of FIG. 10, and FIG. 11B shows the portion A' of FIG. 10. In FIGS. 11A and 11B, a portion shown in white is a portion where a wave phenomenon occurs. Therefore, it can be seen that the wave phenomenon of the display panel occurs less in the portion A' (in FIG. 11B) than in the portion A (in FIG. 11A), but the wave phenomenon still occurs.

Figure 12A:
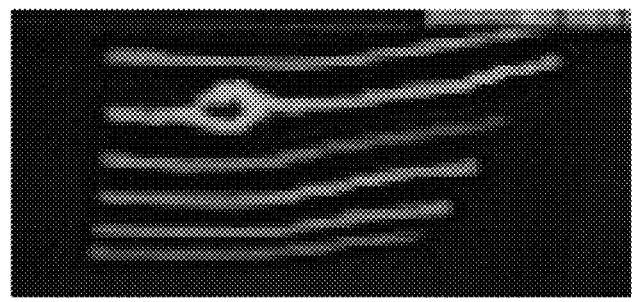
Figure 12B:
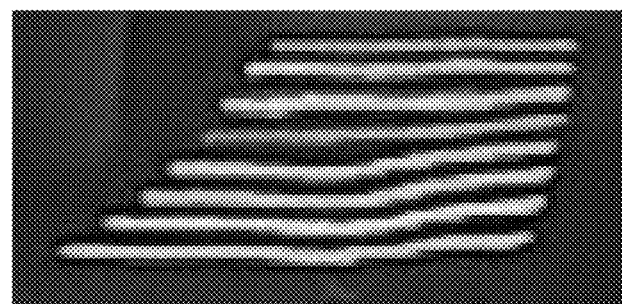

FIGS. 12A and 12B show results obtained by checking (or testing) a portion B and a portion B' of FIG. 10. The portion B and the portion B' may be disposed on the supporting member, e.g., the supporting member 300. Each of the portion B and the portion B' may be a bent portion 712 provided in a first partition 1700 disposed in a third region C. FIG. 12A shows the portion B of FIG. 10, and FIG. 12B shows the portion B' of FIG. 10. In FIGS. 12A and 12B, a portion shown in white is a portion where the wave phenomenon occurs. Therefore, it can be seen that the wave phenomenon of the display panel occurs less in the portion B' (in FIG. 12B) than the portion B (in FIG. 12A), but the wave phenomenon still occurs. Accordingly, it can be seen that even when a shape of the bent portion 712 is modified, the wave phenomenon still occurs.

Therefore, although the inventors have configured a bent portion that allows a vibration to be laterally or left-right transferred or spread, for controlling a peak or a dip phenomenon caused by a standing wave of a sound generation device in a lengthwise direction (a lengthwise direction of a display panel), the wave phenomenon still occurs. As such, to solve the wave phenomenon, the inventors have conducted various experiments for controlling the peak or the dip phenomenon caused by the standing wave or decreasing the wave phenomenon. Through the various experiments, the inventors have invented a display apparatus having a new structure. This will be described below with reference to FIGS. 13A to 18.

FIGS. 13A to 13G illustrate examples of a sound generation device and a partition, in a display apparatus according to an embodiment of the present disclosure.

With reference to FIGS. 13A to 13G, a display panel 100 may include a first region L, a second region R, and a third region C. The first region L may be a left region of a rear surface of the display panel 100, the second region R may be a right region of the rear surface of the display panel 100, and the third region C may be a center region of the rear surface of the display panel 100. For example, one or more sound generation devices may be disposed in at least one of the first region L, the second region R, and the third region C. The one or more sound generation devices may have one or more of a circular shape and an oval shape, or may include a pair of sound generation devices. An oval shape may include an elliptical shape, an egg-shape, a rectangular shape with rounded corners, or other non-circular curved shape having a width different from its height. Embodiments are not limited to these examples. Further, the one or more sound generation devices may vibrate (e.g., directly vibrate) a display panel to generate sound. For example, the one or more sound generation devices may generate a sound having a middle-high-pitched sound band. Further, the one or more sound generation devices may output a stereo sound.

Figure 13A:
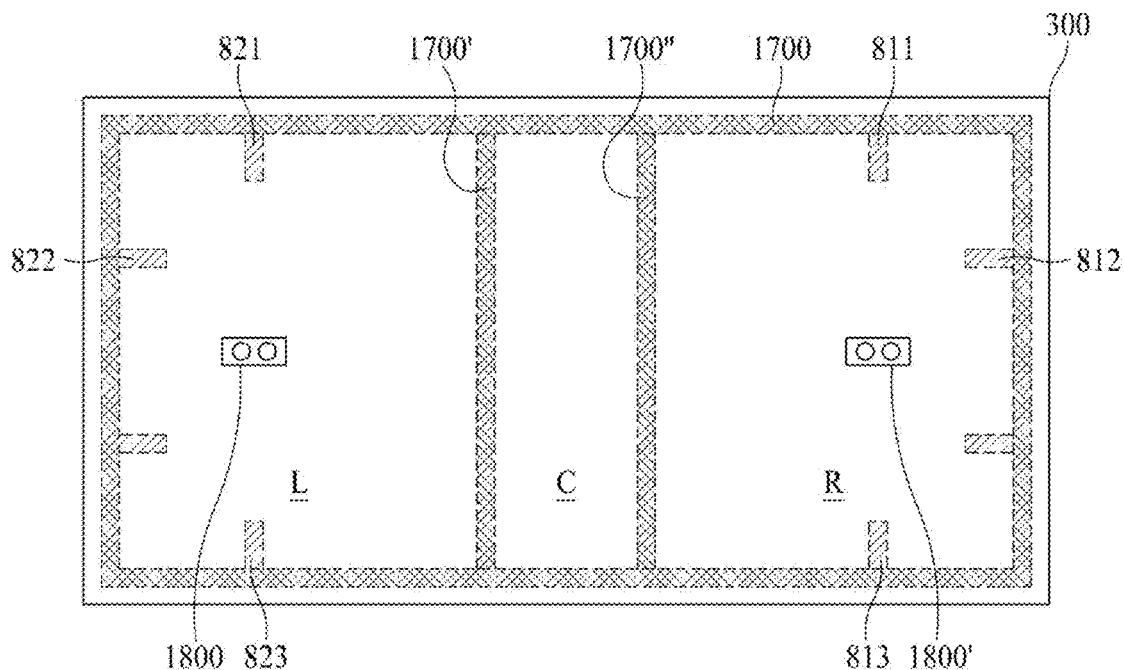
FIGS. 13A to 13G illustrate examples of a sound generation device and a partition, in a display apparatus according to an embodiment of the present disclosure.
Figure 13B:
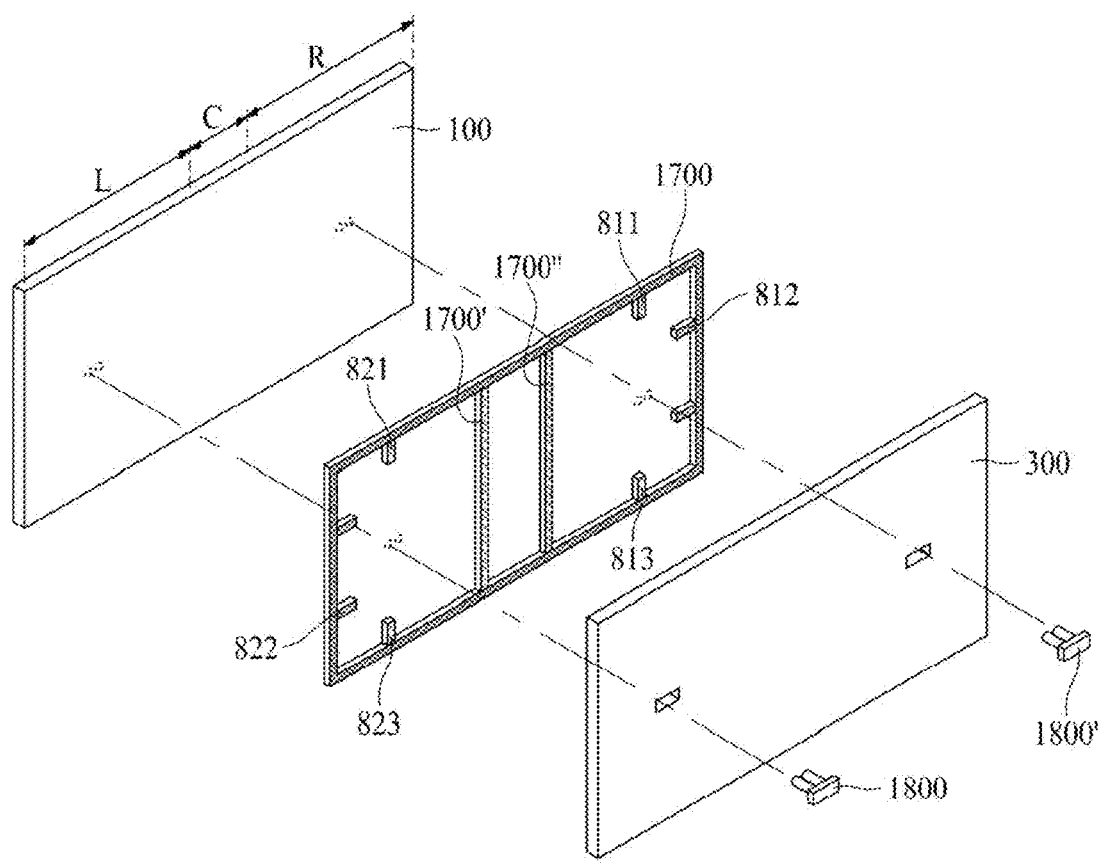

With reference to FIGS. 13A and 13B, a first sound generation device 1800 may be in the first region L of the display panel 100, and a second sound generation device 1800' may be in the second region R of the display panel 100. For example, the first sound generation device 1800 may be in the first region L of a rear surface of the display panel 100, and the second sound generation device 1800' may be in the second region R of the rear surface of the display panel 100. As described above with reference to FIGS. 7 and 8, the first sound generation device 1800 and the second sound generation device 1800' may be coupled or connected to a supporting member 300, and may be disposed between the display panel 100 and the supporting member 300.

The first sound generation device 1800 may be in the first region L, which may be the left region of the rear surface of the display panel 100, and may vibrate the left region of the display panel 100. The second sound generation device 1800' may be in the second region L, which may be the right region of the rear surface of the display panel 100, and may vibrate the right region of the display panel 100. The first sound generation device 1800 and the second sound generation device 1800' may receive different vibration signals, and may be independently driven. For example, the first sound generation device 1800 may generate a sound by using the left region of the display panel 100 as a vibration plate, and the second sound generation device 1800' may generate a sound by using the right region of the display panel 100 as a vibration plate. Such descriptions may be similarly applied to the examples of FIG. 13B to FIG. 16C.

In FIG. 13A, the first sound generation device 1800 and the second sound generation device 1800' may be provided as a pair of sound generation devices. Descriptions of the pair of sound generation devices are substantially similar to the descriptions given above with reference to the examples of FIGS. 5 and 6, and thus, are not repeated. Also, the description given above with reference to the examples of FIGS. 7 and 8 may be applied to a connection structure of the supporting member 300 and the first and second sound generation devices 1800 and 1800'.

Figure 13C:
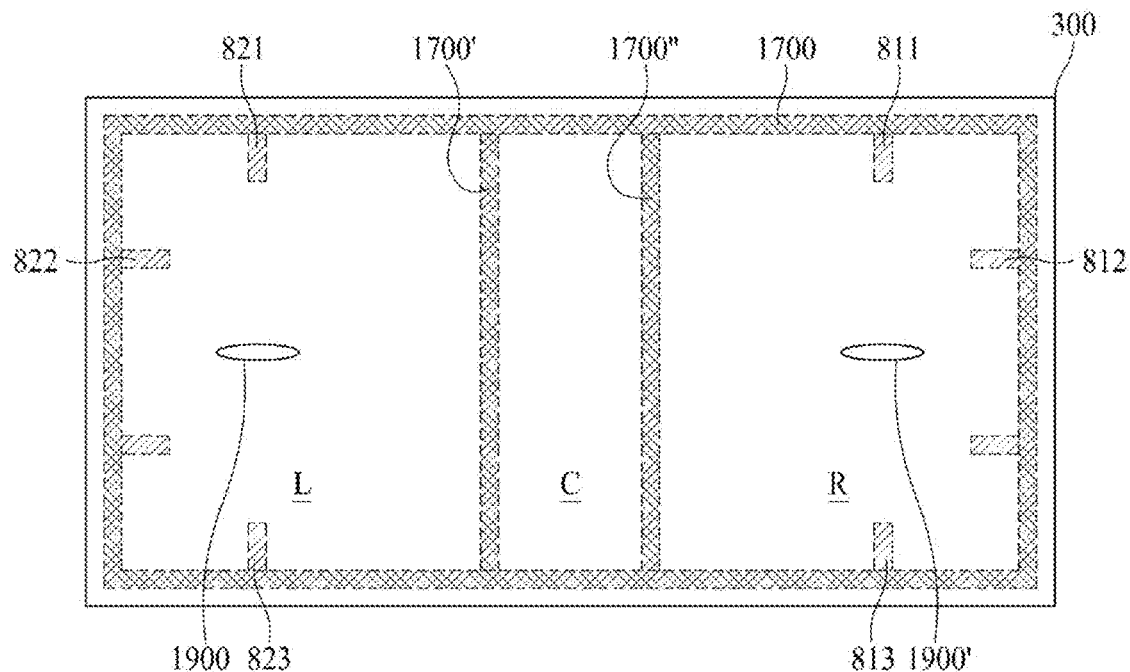

In FIG. 13C, a first sound generation device 1900 and a second sound generation device 1900' may each be configured as an oval sound generation device. Description of the sound generation device given above with reference to the examples of FIGS. 1 and 2 may be applied to the oval sound generation device, and a bobbin may be configured in an oval shape. When the oval sound generation device is applied, a sound output characteristic corresponding to a middle-high-pitched sound band may be enhanced. Also, the description given above with reference to the examples of FIGS. 7 and 8 may be applied to a connection structure of a supporting member and the first and second sound generation devices 1900 and 1900'.

Figure 13D:
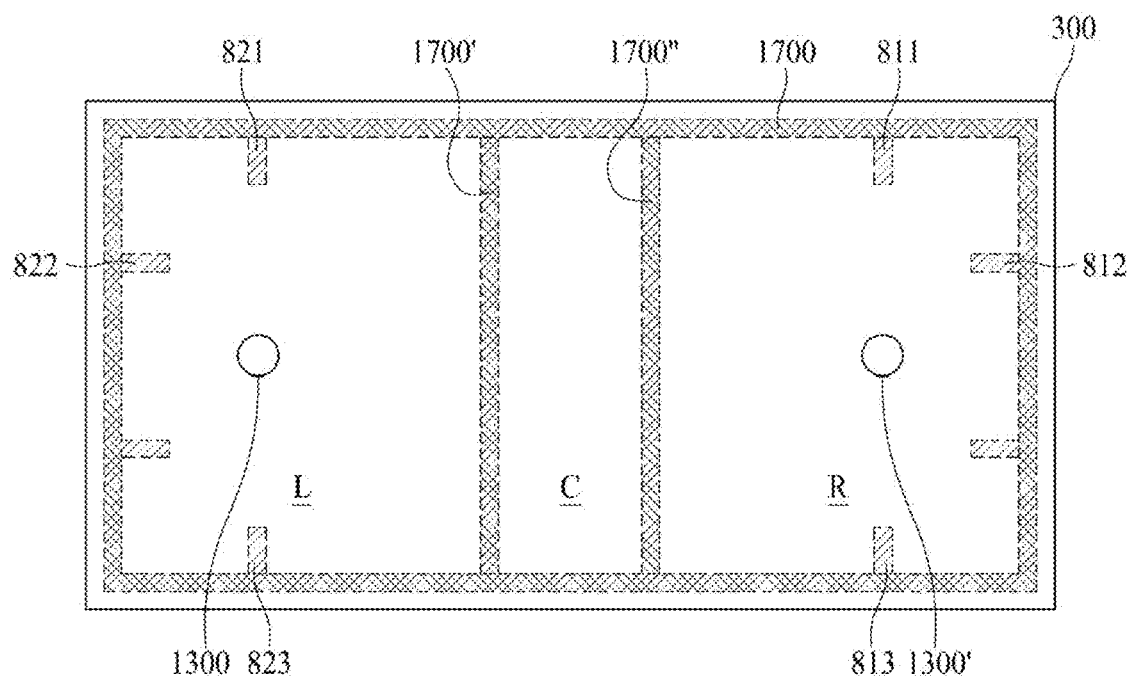

In FIG. 13D, a first sound generation device 1300 and a second sound generation device 1300' may each be configured as a circular sound generation device. The description of the sound generation device given above with reference to the examples of FIGS. 1 and 2 may be applied to the circular sound generation device. Also, the description given above with reference to the examples of FIGS. 7 and 8 may be applied to a connection structure of a supporting member and the first and second sound generation devices 1300 and 1300'.

A partition and a pad part are described with reference to FIG. 13A as an example, and the description of the partition and the pad part may be similarly applied to the examples of FIGS. 13B to 13G. With reference to FIGS. 13A to 13G, a first partition 1700 may be disposed between the display panel 100 and the supporting member 300. For example, the first partition 1700 may be between a rear surface of the display panel and a front surface of the supporting member 300. Also, the first partition 1700 may be on the supporting member 300. For example, the first partition 1700 may be in a periphery of the supporting member 300 or a periphery of a front surface of the supporting member 300. For example, the first partition 1700 may be in a periphery of the display panel. For example, the first partition 1700 may be in a periphery of a rear surface of the display panel. Also, the first partition 1700 may be a whole region or an entire region of the rear surface of the display panel 100 or the supporting member 300. Further, the first partition 1700 may be a whole region of four outer sides of the supporting member 300 or the rear surface of the display panel 100.

With reference to FIG. 13A, at least two partitions, for example, a second partition 1700' and a third partition 1700", may be between the first sound generation device 1800 and the second sound generation device 1800'. For example, the second partition 1700' may be between the first region L and the third region C, and the third partition 1700" may be between the second region R and the third region C.

The first partition 1700, the second partition 1700', and the third partition 1700" may be an air gap or a space where a sound may be generated when the display panel 100 may be vibrated by the first sound generation device 1800 and the second sound generation device 1800'. An air gap or a space that generates or transfers a sound may be referred to as a partition. A partition may be referred to as an "enclosure" or a "baffle," but the term is not limited thereto. For example, the first partition 1700, the second partition 1700', and the third partition 1700" may be provided in a sealed structure, or may be provided in an unsealed structure.

Each of the first partition 1700, the second partition 1700', and the third partition 1700" may reduce or prevent a sound from leaking to each of side surfaces of the display panel 100. Thus, the first to third partitions 1700, 1700', and 1700" may allow the sound to be output to only a region in front of the display panel 100, thereby enhancing sound output characteristics.

The first partition 1700, the second partition 1700', and the third partition 1700" may be between the display panel 100 and the supporting member 300. For example, the first partition 1700, the second partition 1700', and the third partition 1700" may be between the rear surface of the display panel 100 and the front surface of the supporting member 300.

The first partition 1700, the second partition 1700', and the third partition 1700" may be on the supporting member 300. For example, the first partition 1700, the second partition 1700', and the third partition 1700" may be on the front surface of the supporting member 300. The first partition 1700, the second partition 1700', and the third partition 1700" may be on the display panel 100. In the examples illustrated in FIGS. 13A to 16C, the first partition 1700, the second partition 1700', and the third partition 1700" are described as being on the supporting member 300.

The first partition 1700, the second partition 1700', and the third partition 1700" may be disposed close to a periphery of the rear surface of the display panel 100 or the periphery of the front surface of the supporting member 300, thereby reducing the wave phenomenon seen on a screen of the display panel 100. The first partition 1700 may be configured based on the shape of the display panel 100. Thus, workability may be improved in a process of attaching the display panel 100 on the supporting member 300 that supports the rear surface of the display panel 100.

The second partition 1700' and the third partition 1700" may separate a left sound and a right sound respectively generated by the first sound generation device 1800 and the second sound generation device 1800'. A vibration of the display panel 100 performed in a space or an air gap defined as each of the second partition 1700' and the third partition 1700" may be attenuated or absorbed by a center of the display panel 100. Thus, a sound in the left region may not be transferred to a space of the right region. Therefore, when the second partition 1700' and the third partition 1700" are provided, the left sound and the right sound may be separated from each other. Thus, a sound output characteristic may be enhanced. The first sound generation device 1800 and the second sound generation device 1800' may output sounds having a middle-high-pitched sound band. The first sound generation device 1800 and the second sound generation device 1800' may output a stereo sound by separating the left and right sounds, thereby providing a display apparatus having a two-channel sound output characteristic. For example, a middle-pitched sound band may be about 200 Hz to 3 kHz, a high-pitched sound band may be about 3 kHz or more, and a low-pitched sound band may be about 200 Hz or less. However, embodiments are not limited thereto.

The first sound generation device 1800 may be provided in the first region L, which may be the left region; the second sound generation device 1800' may be provided in the second region R, which may be the right region; and a sound generation device may not be provided in the third region C, which may be the center region. Therefore, the degradation in sound quality caused by interference may be reduced in the left region and the right region. Also, a sound characteristic corresponding to the middle-high-pitched sound band may be further enhanced. An area of the third region C may be smaller than each of an area of the first region L and an area of the second region R. Accordingly, a sound characteristic corresponding to the low-pitched sound band may be enhanced. The third region C may decrease the degradation in sound quality caused by interference in the first region L and the second region R. Accordingly, a sound characteristic corresponding to the low, middle, and high-pitched sound bands may be enhanced. The descriptions of the first partition 1700, the second partition 1700', and the third partition 1700" may be similarly applied to the examples of FIGS. 13B to 16C.

In FIGS. 13A to 16C, the first partition 1700 may be the adhesive member described above with reference to the example of FIG. 1. The adhesive member for attaching the supporting member to the display panel may be further provided between the display panel and the supporting member, as described above with reference to the FIG. 1 example. For example, the adhesive member may be further provided in a periphery of the display panel or a periphery of the supporting member.

FIGS. 13A to 16C illustrate examples in which the sound generation device is disposed in the left region or the right region, without being disposed in a center of the left region (the first region L) or the right region (the second region R) of the display panel 100, but embodiments are not limited thereto. For example, the sound generation device may be disposed in the center of the left region (the first region L) or the right region (the second region R) of the display panel 100. In another example, the sound generation device may be asymmetrically disposed in the left region (the first region L) and the right region (the second region R) of the display panel 100. A stereo sound characteristic may be further enhanced when the sound generation device is disposed in a biased position in the left region or the right region, as compared to when the sound generation device is disposed in the center of the left region (the first region L) or the right region (the second region R) of the display panel 100.

A partition having a double structure or a dual-structure including two or more partitions may be provided between the first sound generation device 1800 and the second sound generation device 1800'. For example, the left and right regions of the display panel 100 may have the same vibration characteristic when realizing a mono sound where the left and right regions output the same sound. As such, a resonance phenomenon or an interference phenomenon may be maximized in a certain frequency band, causing the reduction in the sound pressure. Therefore, the partition may be configured in a structure including two or more partitions, e.g., for decreasing an influence of a sound characteristic caused by a resonance frequency difference of a middle-high-pitched sound that may occur in the first sound generation device 1800 provided in the first region L (the left region) and the second sound generation device 1800' provided in the second region R (the right region). When three or more partitions are provided between the first sound generation device 1800 and the second sound generation device 1800', a sound pressure may be avoided or prevented from being reduced, even when sound interference in the left and right regions increases, thereby reducing or preventing a sound output characteristic from being discontinuously recognized.

Therefore, two or more partitions may be provided in a center region of the display panel 100, thereby decreasing an influence of a sound characteristic caused by a resonance frequency difference of a middle-high-pitched sound in the left region and the right region of the display panel 100. When a partition is provided between two sound generation devices, a left sound and a right sound may be separated from each other, thereby enhancing a stereo characteristic of a sound. Different sounds having the middle-high-pitched sound band may be output by the two sound generation devices.

As described above with reference to FIGS. 9 to 12B, the bent part, e.g., the bent part 712, may be provided in the first partition 1700 to decrease a peak and a dip phenomenon caused by a standing wave occurring in a lengthwise (or vertical) direction of the first and second sound generation devices 1800 and 1800'. The peak may be a phenomenon in which a sound pressure bounces in a particular frequency. The dip may be a phenomenon in which generation of a particular frequency is suppressed. Thus, a low sound pressure may be generated. A sound output characteristic of the display apparatus may be reduced by the peak or the dip phenomenon. The inventors have recognized that the first partition 1700 may be implemented in another shape for decreasing a wave phenomenon caused by the bent part. Therefore, the inventors have recognized that the first partition 1700 may be disposed based on a shape of the display panel 100 without the bent part to decrease the wave phenomenon.

The first partition 1700 may be disposed based on a shape of the display panel 100. For example, the first partition 1700 may have a tetragonal (e.g., rectangular or square) shape, but embodiments are not limited thereto. For example, a shape of the first partition 1700 may be modified based on a shape of the display panel 100. If the display panel 100 is a curved display panel having a curved shape or curve shape, or the like, the first partition 1700 may have a correspondingly curved shape or a curve shape. Accordingly, the first partition 1700 may be disposed based on a shape of the display panel 100. Thus, a degree to which the display panel 100 is pulled may be reduced when attaching the supporting member to the display panel 100, thereby reducing or preventing the wave phenomenon.

However, if the first partition 1700 is provided, it may be unable to control the peak and the dip phenomenon caused by the standing wave. Thus, the inventors have recognized that the first partition 1700 may have a structure for controlling the peak and the dip phenomenon caused by the standing wave. The structure may be configured to reduce or prevent the wave phenomenon and to enable the peak and the dip phenomenon caused by the standing wave to be easily controlled. The structure may not be implemented through a simple procedure, but has been implemented through the various experiments.

Therefore, a pad part may be provided on one or more sides of the first partition 1700 for decreasing the peak or the dip phenomenon caused by the standing wave. For example, the first partition 1700 may include a first side, and a second side perpendicular to the first side. A plurality of first pad parts 811 and 821 may be provided on the first side. For example the first pad parts 811 and 821 may be in at least one of a first region L and a second region R. The first pad parts 811 and 821 may be respectively provided as one or as a plurality. The first side may be disposed in a widthwise (or horizontal) direction of the display panel 100 or the supporting member 300, and the second side may be disposed in a lengthwise (or vertical) direction of the display panel 100 or the supporting member 300.

The first pad parts 811 and 821 may be disposed in a first direction of the display panel 100 or the supporting member 300. The first direction may be the widthwise (or horizontal) direction of the display panel 100 or the supporting member 300, and a second direction may be a direction perpendicular to the first direction and may be the lengthwise (or vertical) direction of the display panel 100 or the supporting member 300.

The first pad parts 811 and 821 may face (or extend to point toward) the first sound generation device 1800 and the second sound generation device 1800'. For example, the first pad part 821 may be disposed in the first region L to face the first sound generation device 1800, and the first pad part 811 may be disposed in the second region R to face the second sound generation device 1800'. Accordingly, the pad parts 811 and 821 may decrease the peak or the dip phenomenon caused by the standing wave that may occur in a lengthwise (or vertical) direction of the first sound generation device 1800 and the second sound generation device 1800', and may allow a vibration to be laterally or left-right transferred or spread, thereby enhancing sound output characteristics.

A shape of a pad part disposed on the supporting member may be provided to reduce or prevent the wave phenomenon from occurring when the display panel 100 is pulled when attaching the pad part to the display panel 100. Alternatively, a shape of a pad part disposed in the display panel 100 may be provided to reduce or prevent the wave phenomenon from occurring when the display panel 100 is pulled when attaching the pad part to the display panel 100. Therefore, the inventors have conducted various experiments on shapes of the first pad parts 811 and 821 to reduce the wave phenomenon that occurs when the bent portion is configured as described above with reference to the examples of FIGS. 9 to 12, for decreasing the peak or the dip phenomenon caused by the standing wave. Also, an example in which a partition is disposed in the supporting member is described, and even when the partition is disposed on the rear surface of the display panel, the wave phenomenon may occur. Therefore, the partition may be disposed on the rear surface of the display panel or the front surface of the supporting member, or may be disposed between the rear surface of the display panel and the front surface of the supporting member, but embodiments are not limited thereto.

Accordingly, the shape of the pad parts may not be modified through a simple procedure, but has been modified through the various experiments. For example, the shape of the pad parts may be implemented to reduce or prevent the wave phenomenon, and to enable the peak and the dip phenomenon caused by the standing wave to be easily controlled. The pad parts have been implemented in a tetragonal (e.g., rectangular or square) shape or a rounded-end tetragonal (e.g., rectangular or square) shape through the various experiments.

The first partition 1700 may be formed of one or more of: a double-sided tape, a single-sided tape, an adhesive, and a bond, but embodiments are not limited thereto. If the first partition 1700 is formed of the double-sided tape, an adhesive force may be enhanced when the front surface of the supporting member is attached to the rear surface of the display panel 100. For example, the first partition 1700 may be formed of a material having an elasticity that may enable compression to be formed to some extent. For example, the first partition 1700 may be formed of polyurethane, polyolefin, polyethylene, and/or the like, but embodiments are not limited thereto.

The second partition 1700' and the third partition 1700" may be formed of the same material as that of the first partition 1700. If the second partition 1700' and the third partition 1700" are formed of the same material as that of the first partition 1700, an adhesive force may be enhanced when the supporting member is attached to the display panel 100. The second partition 1700' and the third partition 1700" may be formed of a double-sided tape, but embodiments are not limited thereto. For example, the second partition 1700' and the third partition 1700" may be formed of a material having an elasticity that may enable compression to be formed to some extent. For example, the second partition 1700' and the third partition 1700" may be formed of polyurethane, polyolefin, polyethylene, and/or the like, but embodiments are not limited thereto.

The first partition 1700, the second partition 1700', and the third partition 1700" may be disposed close to the periphery of the rear surface of the display panel 100 or the periphery of the front surface of the supporting member 300, thereby reducing the wave phenomenon seen on a screen of the display panel 100. The first partition 1700 may be configured based on the shape of the display panel 100. Thus, workability may be improved when attaching the display panel 100 to the supporting member 300 that may support the rear surface of the display panel 100.

Various experiments have been conducted so that the first pad parts 811 and 821 may be formed of materials for decreasing a phenomenon in which the display panel 100 may be pulled when attaching the supporting member to the display panel 100. The inventors have recognized that the first pad parts 811 and 821 in the first partition 1700 may be formed of materials for decreasing a phenomenon in which the display panel 100 is pulled when contacting the display panel 100. Therefore, the inventors have conducted various experiments on a material that reduces or prevents the wave phenomenon, and enables the peak or the dip phenomenon caused by the standing wave to be controlled, instead of simply changing a material. The inventors have recognized that the first pad parts 811 and 821 may be formed of materials having an adhesive force weaker than that of the first partition 1700, based on the various experiments. When the first pad parts 811 and 821 are formed of the same material as that of the first partition 1700, it has been confirmed that the wave phenomenon may occur at a position at which the first pad parts 811 and 821 are disposed. The inventors have recognized that a reason is because, where an adhesive force of the first partition is the same as that of the pad parts, the display panel 100 may be more pulled at the positions where the pad parts are disposed. Thus, the wave phenomenon may occur. For example, when the first partition and the pad parts on the supporting member are formed of materials having the same adhesive force, the wave phenomenon may occur where the pad parts are disposed when the first partition 1700 and the pad parts on the supporting member are attached to the display panel 100.

The first partition and the pad parts on the supporting member are described with reference to the examples of FIGS. 13A to 16C, but embodiments are not limited thereto. A substantially similar description may also be applied to a case in which the first partition and the pad parts are on the rear surface of the display panel 100. For example, when the first partition and the pad parts on the rear surface of the display panel are formed of materials having the same adhesive force, the wave phenomenon can occur where the pad parts are disposed when the supporting member is attached to the first partition and the pad parts on the rear surface of the display panel.

Therefore, the first pad parts 811 and 821 may be formed of materials that differ from that of the first partition 1700. Alternatively, the first pad parts 811 and 821 may be formed of materials that differ from those of the first partition 1700, the second partition 1700', and the third partition 1700". For example, the first pad parts 811 and 821 may be formed of materials having an adhesive force weaker than that of the first partition 1700. The first pad parts 811 and 821 may be formed of materials having an adhesive force weaker than that of the first partition 1700, the second partition 1700', and the third partition 1700". The first pad parts 811 and 821 may be respectively formed of the same or different materials.

The first pad parts 811 and 821 may be formed of, for example, a single-sided tape. The single-sided tape may include a foam material that may absorb an impact when contacting the display panel 100. If the single-sided tape does not include the foam material, an undesired abnormal sound may occur due to contacting the display panel 100. The single-sided tape may be formed of, for example, polyurethane, polyolefin, polyethylene, and/or the like, but embodiments are not limited thereto. When the first partition 1700 and the first pad parts 811 and 821 are formed of different materials, the term "different materials" may be the same materials having different adhesive forces. Alternatively, the term "different materials" may be different materials having different adhesive forces, but embodiments are not limited thereto.

Therefore, the first partition 1700 may be formed of a material having a strong adhesive force, e.g., for an adhesive force between the display panel 100 and the supporting member 300. The first pad parts 811 and 821 may be formed of a material having an adhesive force weaker than that of a material of the first partition 1700, thereby decreasing the wave phenomenon.

Second pad parts 812 and 822 may be further provided on a second side of the first partition 1700. The second pad parts 812 and 822 may further decrease the peak or the dip phenomenon caused by the standing wave that may occur due to interference of the reflected wave and the progressive wave, and may reduce or prevent sound quality from being degraded by the standing wave or the reflected wave. The second pad parts 812 and 822 may be on one or more sides of the first partition 1700. The second pad parts 812 and 822 may be disposed in at least one of a first region L and a second region R. For example, the second pad part 822 may be on the second side of the first partition 1700 in the first region L, and the second pad part 812 may be on the second side of the first partition 1700 in the second region R. The second pad parts 812 and 822 may be symmetrically disposed with respect to the sound generation device. In the FIG. 13A example, one or more second pad parts 812 and 822 are illustrated as on one of a first side and a second side, perpendicular to the first side, among four sides of the display panel 100, but embodiments are not limited thereto. For example, two or more pad parts 812 and 822 may be respectively provided.

The second pad parts 812 and 822 may be formed of one of a double-sided tape, a single-sided tape, an adhesive, and a bond, but embodiments are not limited thereto. When the second pad parts 812 and 822 are formed of materials that differ from those of the first pad parts 811 and 821, the wave phenomenon may occur due to different adhesive forces when the second pad parts 812 and 822 contact the display panel 100. Therefore, the inventors have recognized that, when the second pad parts 812 and 822 are formed of the same material as that of the first pad parts 811 and 821, the wave phenomenon may be reduced, and the occurrence of an abnormal sound may be reduced. The second pad parts 812 and 822 may be formed of, for example, a single-sided tape. The single-sided tape may include a foam material that may absorb an impact when contacting the display panel 100. When the single-sided tape does not include the foam material, an undesired abnormal sound may occur due to contacting the display panel 100. The single-sided tape may be formed of, for example, polyurethane, polyolefin, polyethylene, and/or the like, but embodiments are not limited thereto.

Third pad parts 813 and 823 may be further provided on a side facing the first side of the first partition 1700. For example, the third pad part 823 may be on a side facing the first side of the first partition 1700 in the first region L, and the third pad part 813 may be on a side facing the first side of the first partition 1700 in the second region R. The third pad part 813 may face the pad part 811, and the third pad part 823 may face the pad part 821. And, the third pad parts 813 and 823 may be provided as one or more. Therefore, the first pad parts 811 and 821 and the third pad parts 813 and 823 may trap a reflected wave from the first and second sound generation devices 1800 and 1800', thereby decreasing the peak or the dip phenomenon caused by the standing wave. The second pad parts 812 and 822 may further reduce the peak or the dip phenomenon caused by the standing wave that may occur due to interference of a reflected wave and a progressive wave, and may avoid or prevent sound quality from being reduced by the standing wave or the reflected wave.

The third pad parts 813 and 823 may be formed of one of a double-sided tape, a single-sided tape, an adhesive, and a bond, but embodiments are not limited thereto. When the third pad parts 813 and 823, disposed to face the first pad parts 811 and 821, are formed of materials that differ from those of the first pad parts 811 and 821, the wave phenomenon may occur due to different adhesive forces when the third pad parts 813 and 823 contact the display panel 100. Therefore, the inventors have recognized that, when the third pad parts 813 and 823 are formed of the same material as that of the first pad parts 811 and 821, the wave phenomenon may be reduced, and the occurrence of an abnormal sound may be reduced. The third pad parts 813 and 823 may be formed of, for example, a single-sided tape. The single-sided tape may include a foam material that may absorbs an impact when contacting the display panel 100. When the single-sided tape does not include the foam material, an undesired abnormal sound may occur due to contacting the display panel 100. The single-sided tape may be formed of, for example, polyurethane, polyolefin, polyethylene, and/or the like, but embodiments are not limited thereto.

The one or more first pad parts 811 and 821 may be formed of the same material as that of at least one of the one or more second pad parts 812 and 822 and the one or more third pad parts 813 and 823. For example, the one or more first pad parts 811 and 821 may be formed of the same material as that of the one or more second pad parts 812 and 822 and the one or more third pad parts 813 and 823.

Therefore, the first partition 1700, the second partition 1700', and the third partition 1700" may be formed of materials that differ from those of the first pad parts 811 and 821, the second pad parts 812 and 822, and the third pad parts 813 and 823. For example, the first partition 1700, the second partition 1700', and the third partition 1700" may be formed of materials having an adhesive force that differs from those of materials of the first pad parts 811 and 821, the second pad parts 812 and 822, and the third pad parts 813 and 823. For example, the first partition 1700, the second partition 1700', and the third partition 1700" may be formed of a double-sided tape, and the first pad parts 811 and 821, the second pad parts 812 and 822, and the third pad parts 813 and 823 may be formed of a single-sided tape. When the first partition 1700, the second partition 1700', and the third partition 1700" may be formed of materials that differ from those of the first pad parts 811 and 821, the second pad parts 812 and 822, and the third pad parts 813 and 823, the materials may be the same materials having different adhesive forces. Alternatively, the materials may be different materials having different adhesive forces, but embodiments are not limited thereto.

As a size of the first pad parts 811 and 821, a size of the second pad parts 812 and 822, and a size of the third pad parts 813 and 823 increase, it may be easier to control the peak or the dip phenomenon caused by the standing wave. For example, if a width of the first pad part 811 and a width of the second pad part 812 are less than 10 mm, it may be difficult to control the peak or the dip phenomenon caused by the standing wave. Therefore, the width of the first pad part 811 and the width of the second pad part 812 may each be set to be to 10 mm or more. The size of the third pad part 813 may be equal to that of the pad part 811, but embodiments are not limited thereto. For example, a width of the third pad part 813 may be 10 mm or more, and a length of the third pad part 813 may be 50 mm or less. However, embodiments are not limited thereto. For example, a width of the third pad part 813 may be 10 mm or more, and a length of the third pad part 813 may be 30 mm or less. The size of the pad part 811, the size of the second pad part 812, and the size of the third pad part 813 in the second region R may be similarly applied respectively to the pad part 821, the second pad part 822, and the third pad part 823 in the first region L.

The size of the first pad parts 811 and 821 may be greater than or equal to that of the second pad parts 812 and 822, but embodiments are not limited thereto. A length of the first pad part 811 may be equal to or longer than that of the second pad part 812. For example, the length of the first pad part 811 may be 90 mm or less, and a length of the second pad part 812 may be 30 mm or less. However, embodiments are not limited thereto. The length of the first pad part 811 and the length of the second pad part 812 may be similarly respectively applied to the first pad part 821 and the second pad part 822 provided in the first region L.

A shape of the first pad parts 811 and 821, a shape of the second pad parts 812 and 822, and a shape of the third pad parts 813 and 823 may be a tetragonal (e.g., rectangular or square) shape or a rounded-end tetragonal shape. However, the shape of the first pad parts 811 and 821, the shape of the second pad parts 812 and 822, and the shape of the third pad parts 813 and 823 may be provided as various shapes, such as a circular shape. Embodiments are not limited to these examples.

A partition may be configured based on a shape of a display panel, and one or more pad parts may be provided on at least one side of the partition, thereby decreasing the wave phenomenon and reducing the peak or the dip phenomenon caused by the standing wave. Accordingly, a sound output characteristic may be enhanced. The partition and the pad parts may be formed of different materials. Thus, the occurrence of an abnormal sound may be reduced or prevented, thereby enhancing a sound output characteristic.

Figure 13E:
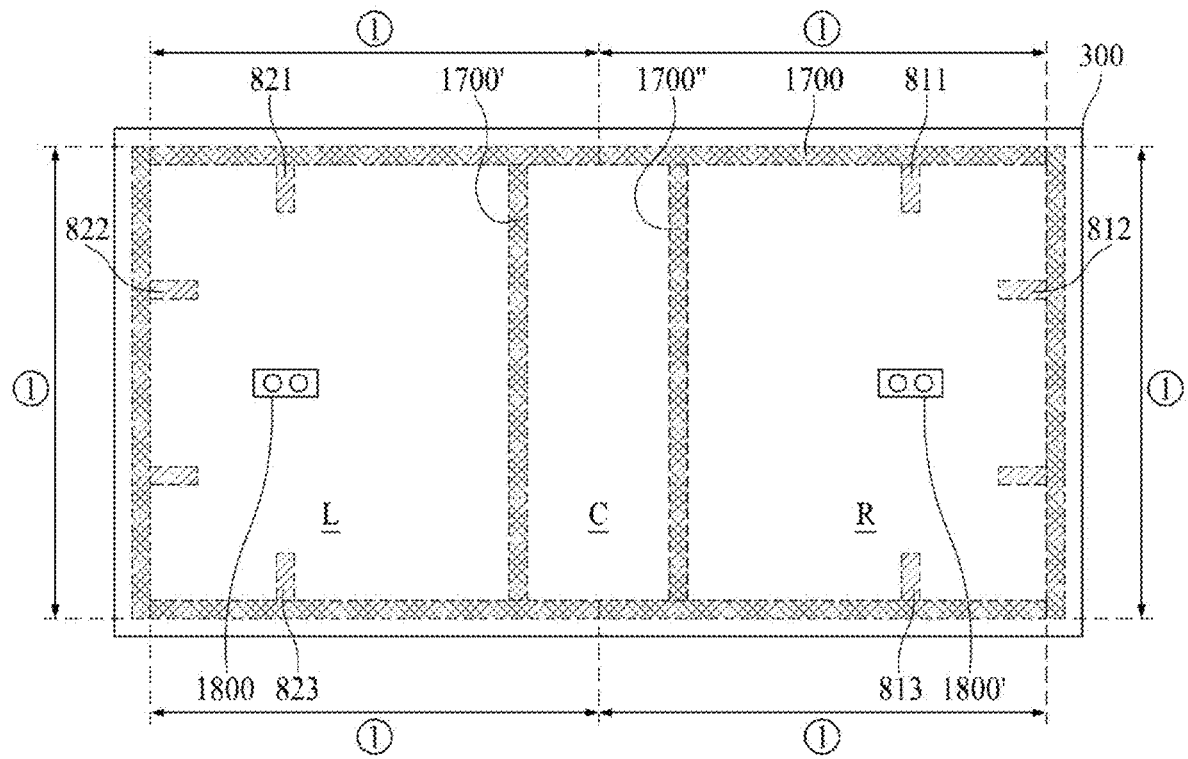
Figure 13F:
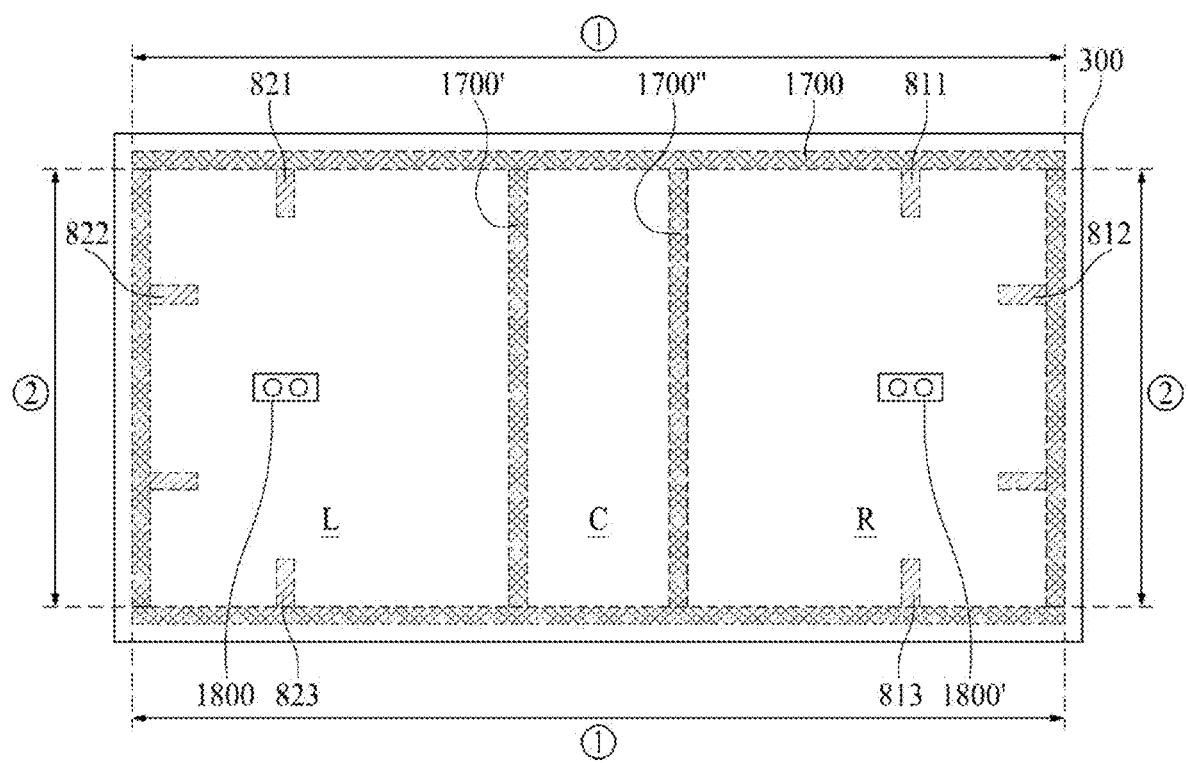
Figure 13G:
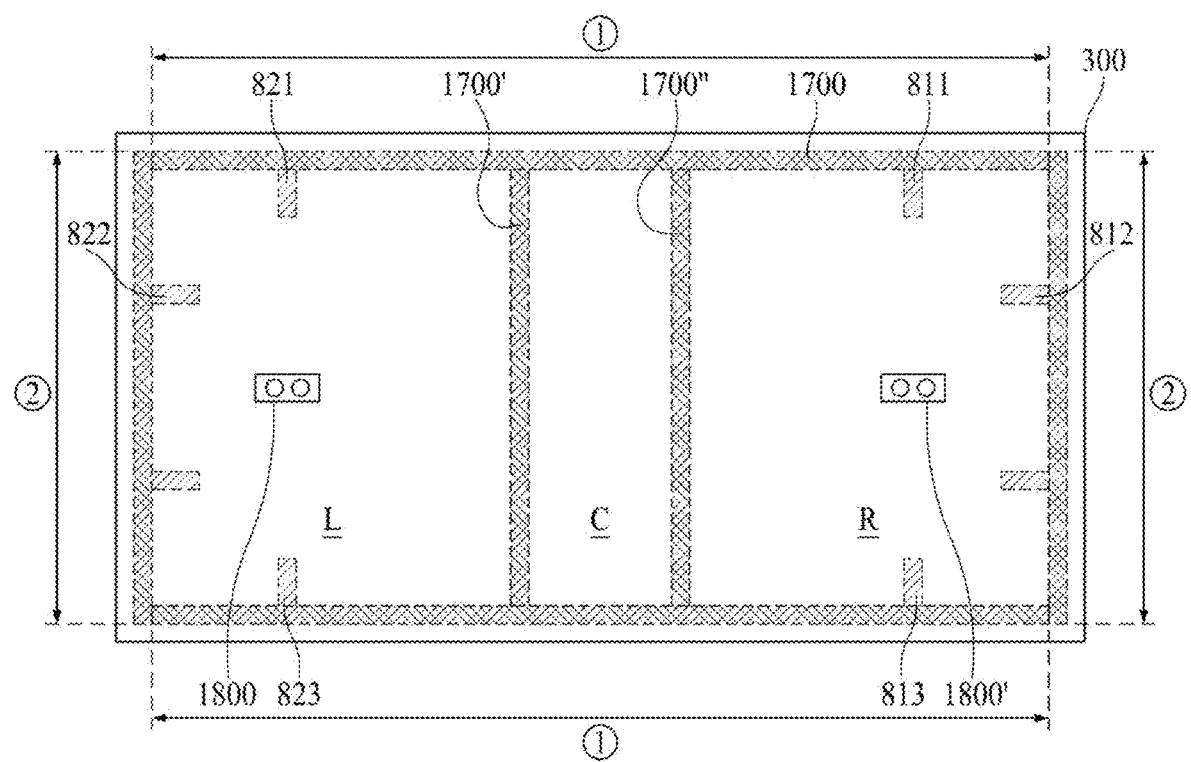

With reference to FIGS. 13E to 13G, an example in which the first partition 1700 is divisionally disposed to have the same size is illustrated. Therefore, efficiency may be enhanced when the partition is provided. For example, when the partition is applied to a large-screen display apparatus, efficiency may be enhanced when the partition is provided in a large screen.

In FIGS. 13E to 13G, numbers in circles represent that sides of the partition have the same size. For example, in FIG. 13E, the first partition 1700 may be divided into two portions, and the two portions may be disposed to have the same size ① in a widthwise (or horizontal) direction and a lengthwise (or vertical) direction of the display panel 100 or the supporting member 300. For example, six portions of the first partition 1700 may have the same size ①. With reference to FIG. 13F, widthwise portions of the first partition 1700 may have the same size ① in the widthwise (or horizontal) direction of the display panel 100 or the supporting member 300, and lengthwise portions of the first partition 1700 may have the same size ② in the lengthwise (or vertical) direction of the display panel 100 or the supporting member 300. With reference to FIG. 13G, widthwise portions of the first partition 1700 may have the same size ① in a widthwise (or horizontal) direction of the display panel 100 or the supporting member 300, and lengthwise portions of the first partition 1700 may be have the same size ② in a lengthwise (or vertical) direction of the display panel 100 or the supporting member 300. However, embodiments of the present disclosure are not limited thereto, and the various portions of the first partition 1700 may have various sizes.

In FIGS. 13E to 13G, a pair of sound generation devices has been described by way of example. Descriptions given above with reference to the examples of FIGS. 13E to 13G may be similarly applied to a circular sound generation device and an oval sound generation device. However, embodiments are not limited to these examples. The descriptions given above with reference to the examples of FIGS. 13E to 13G may be similarly applied to the examples of FIGS. 14A to 16C.

Figure 14A:
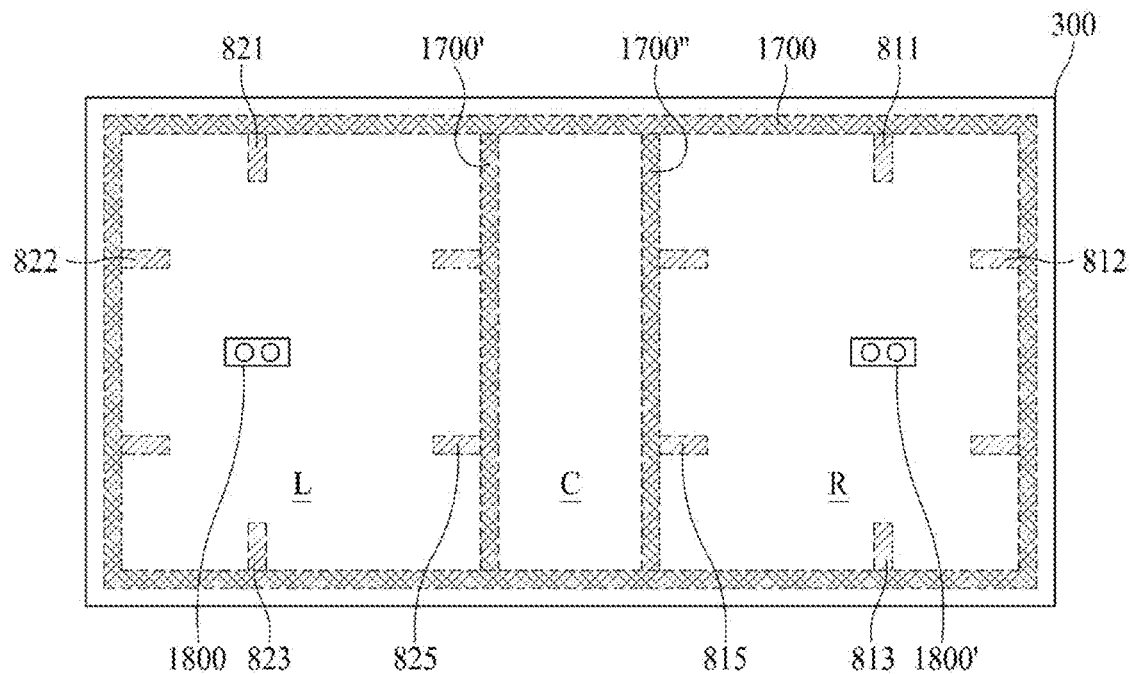
FIGS. 14A to 14C illustrate examples of a sound generation device and a partition, in a display apparatus according to an embodiment of the present disclosure.
Figure 14B:
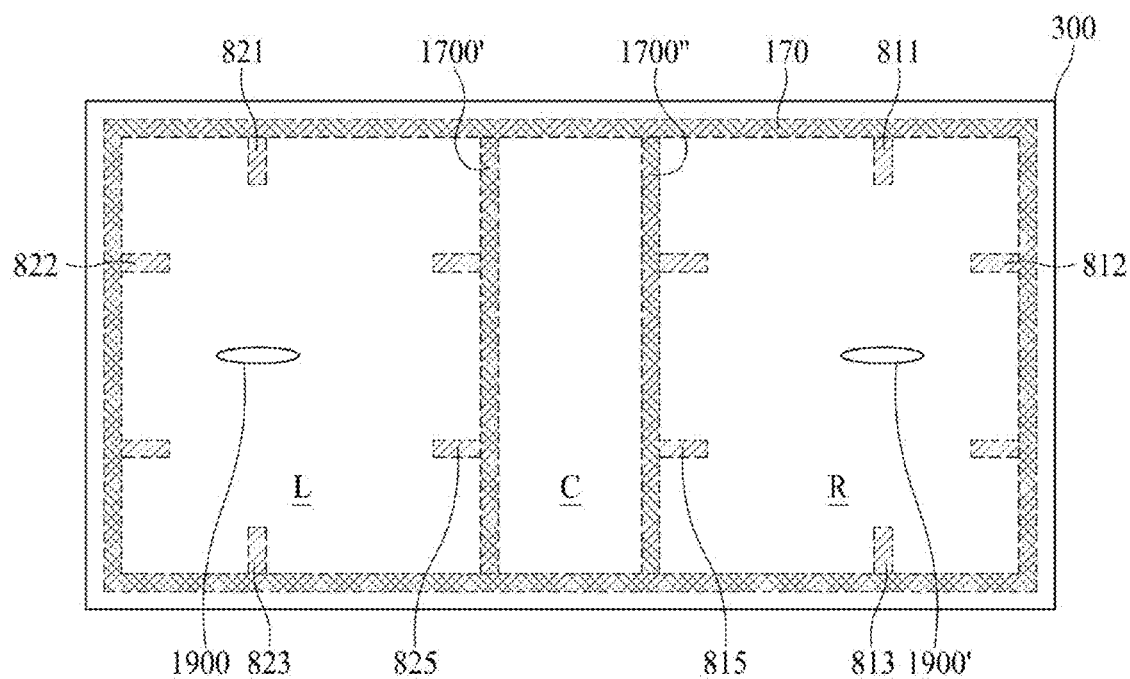
Figure 14C:
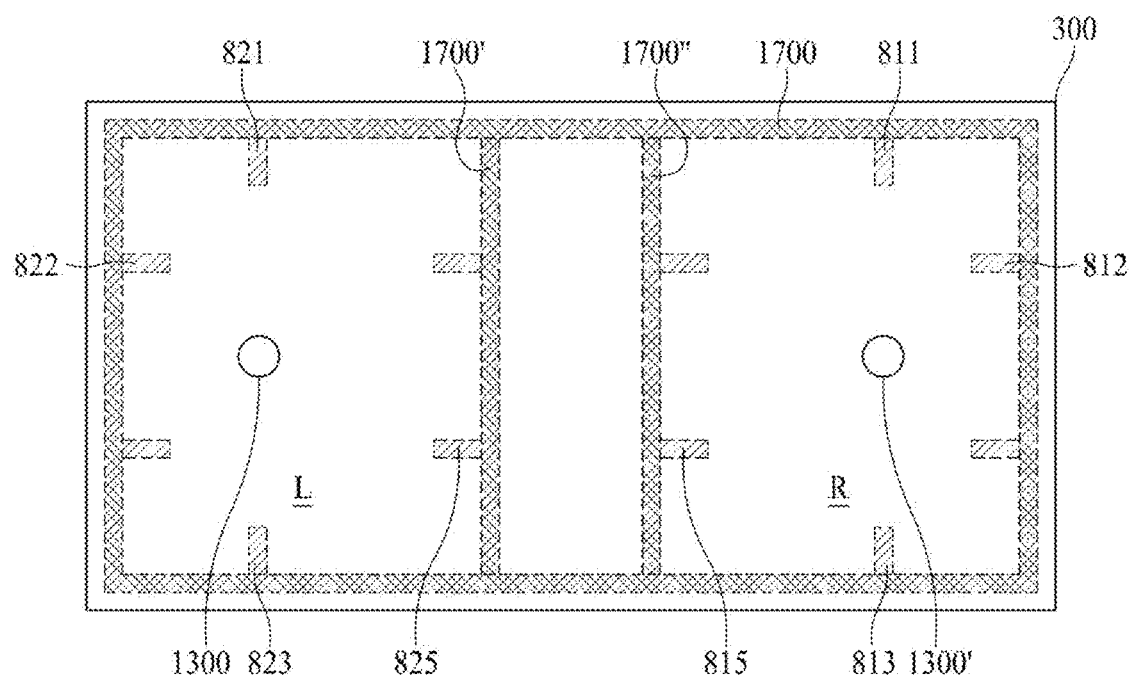

FIGS. 14A to 14C illustrate examples of a sound generation device and a partition according to an embodiment of the present disclosure.

In FIGS. 14A to 14C, duplicate descriptions as those given above with reference to the examples of FIGS. 13A to 13G are omitted or will be briefly provided. For example, descriptions of a sound generation device, a pad part, a second pad part, and a third pad part are omitted or will be briefly provided. Also, a partition and a pad part will be described with reference to the FIG. 14A example, and the descriptions of the partition and the pad part may be similarly applied to examples of FIGS. 14B and 14C.

With reference to FIGS. 14A to 14C, a first partition 1700 may be disposed between a display panel and a supporting member 300. For example, the first partition 1700 may be between a rear surface of the display panel 100 and a front surface of the supporting member 300. The first partition 1700 may be on the supporting member 300. For example, the first partition 1700 may be in a periphery of the supporting member 300 or a periphery of the front surface of the supporting member 300. The first partition 1700 may be in a periphery of the display panel 100. For example, the first partition 1700 may be on the rear surface of the display panel 100 or in a periphery of the supporting member 300. The first partition 1700 may be a whole or entire region of four outer sides of the supporting member or the rear surface of the display panel 100.

The first partition 1700 may be disposed along (or may be based on) a shape of the display panel. For example, the first partition 1700 may have a tetragonal (e.g., rectangular or square) shape, but embodiments are not limited thereto. For example, a shape of the first partition 1700 may be modified based on a shape of the display panel. If the display panel is a curved display panel having a curved shape or curve shape, or the like, the first partition 1700 may have a correspondingly curved shape or curve shape. Accordingly, the first partition 1700 may be disposed along (or may be based on) a shape of the display panel, thereby reducing or preventing the wave phenomenon.

With reference to FIG. 14A, at least two partitions, for example, a second partition 1700' and a third partition 1700", may be disposed between a first sound generation device 1800 and a second sound generation device 1800'. For example, the second partition 1700' may be disposed between a first region L and a third region C, and the third partition 1700" may be disposed between a second region R and the third region C.

The first partition 1700, the second partition 1700', and the third partition 1700" may be disposed between the display panel and the supporting member 300. For example, the first partition 1700, the second partition 1700', and the third partition 1700" may be between the rear surface of the display panel and the front surface of the supporting member 300. The first partition 1700, the second partition 1700', and the third partition 1700" may be on the supporting member 300. The first partition 1700, the second partition 1700', and the third partition 1700" may be on the display panel.

The first partition 1700, the second partition 1700', and the third partition 1700" may be formed of the same material. The first partition 1700, the second partition 1700', and the third partition 1700" may be formed of a double-sided tape, but embodiments are not limited thereto. For example, the first partition 1700, the second partition 1700', and the third partition 1700" may be formed of a material having an elasticity that may enable compression to be formed to some extent. For example, the first partition 1700, the second partition 1700', and the third partition 1700" may be formed of polyurethane, polyolefin, polyethylene, and/or the like, but embodiments are not limited thereto.

The first partition 1700, the second partition 1700', and the third partition 1700" may be disposed close to a periphery of the rear surface of the display panel or a periphery of the top of the supporting member 300, thereby reducing the wave phenomenon seen on a screen of the display panel. The first partition 1700 may be configured based on the shape of the display panel. Thus, workability may be improved when attaching the display panel to the supporting member 300 that may support the rear surface of the display panel.

A pad part may be provided on one or more sides of the first partition 1700, e.g., for decreasing the peak or the dip phenomenon caused by the standing wave that may occurs in a lengthwise (or vertical) direction of the first and second sound generation devices 1800 and 1800'. For example, the first partition 1700 may include a first side and a second side perpendicular to the first side, and a plurality of first pad parts 811 and 821 may be provided on the first side. The first pad parts 811 and 821 may be provided as one or as a plurality. The first side may be disposed in a widthwise (or horizontal) direction of the display panel 100 or the supporting member 300, and the second side may be disposed in a lengthwise (or vertical) direction of the display panel 100 or the supporting member 300.

Second pad parts 812 and 822 may be further provided on the second side of the first partition 1700. One or more second pad parts 812 and 822 may be provided on one or more sides of the first partition 1700. The second pad parts 812 and 822 may be disposed in at least one of the first region L and the second region R.

One or more pad parts may face or disposed toward one or more sound generation devices. For example, third pad parts 813 and 823 may be further provided on a side facing a first side of the first partition 1700. The third pad part 823 may be on the side facing the first side of the first partition 1700 in the first region L, and the third pad part 813 may be on the side facing the first side of the first partition 1700 in the second region R. The third pad part 813 may face the pad part 811, and the third pad part 823 may face the pad part 821. The third pad parts 813 and 823 may be provided as one or as a plurality.

One or more fourth pad parts 815 and 825 may be further provided on a side facing the second side of the first partition 1700. For example, the fourth pad part 825 may be on a side facing the second side of the first partition 1700 in the first region L, and the fourth pad part 815 may be on a side facing the second side of the first partition 1700 in the second region R. The fourth pad part 815 may face the second pad part 812, and the fourth pad part 825 may face the second pad part 822. The fourth pad parts 815 and 825 may be provided as one or as a plurality. Therefore, the first pad parts 811 and 821, the second pad parts 812 and 822, the third pad parts 813 and 823, and the fourth pad parts 815 and 825 may trap a reflected wave from the first and second sound generation devices 1800 and 1800'. Thus, the first pad parts 811 and 821, the second pad parts 812 and 822, the third pad parts 813 and 823, and the fourth pad parts 815 and 825 may decrease the peak or the dip caused by the standing wave. The second pad parts 812 and 822 and the fourth pad parts 815 and 825 may further reduce the peak or the dip phenomenon caused by the standing wave that occurs due to interference of a reflected wave and a progressive wave, and may avoid or prevent sound quality from being reduced by the standing wave or the reflected wave.

The fourth pad parts 815 and 825 may be formed of one of a double-sided tape, a single-sided tape, an adhesive, and a bond, but embodiments are not limited thereto. The fourth pad parts 815 and 825 may face the second pad parts 812 and 822. Thus, when the fourth pad parts 815 and 825 are formed of materials that differ from those of the second pad parts 812 and 822, the wave phenomenon may occur due to different adhesive forces when the fourth pad parts 815 and 825 contact the display panel. Therefore, when the fourth pad parts 815 and 825 are formed of the same material as that of the second pad parts 812 and 822, the wave phenomenon may be reduced, and the occurrence of an abnormal sound may be reduced. The fourth pad parts 815 and 825 may be formed of, for example, a single-sided tape. The single-sided tape may include a foam material that may absorb an impact when contacting the display panel. When the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

The one or more first pad parts 811 and 821 may be formed of the same material as that of at least one of the one or more second pad parts 812 and 822, the one or more third pad parts 813 and 823, and the one or more fourth pad parts 815 and 825. The one or more first pad parts 811 and 821, the one or more second pad parts 812 and 822, the one or more third pad parts 813 and 823, and the one or more fourth pad parts 815 and 825 may be formed of the same material.

For example, the one or more first pad parts 811 and 821, the one or more second pad parts 812 and 822, the one or more third pad parts 813 and 823, and the one or more fourth pad parts 815 and 825 may be formed of, for example, a single-sided tape. The single-sided tape may include a foam material that may absorb an impact when contacting the display panel. When the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

As a size of the first pad parts 811 and 821, a size of the second pad parts 812 and 822, a size of the third pad parts 813 and 823, and a size of the fourth pad parts 815 and 825 increase, it may be easier to control the peak or the dip phenomenon caused by the standing wave. For example, if a width of the first pad part 811 and a width of the second pad part 812 are less than 10 mm, it may be difficult to control the peak or the dip phenomenon caused by the standing wave. Therefore, the width of the first pad part 811 and the width of the second pad part 812 may each be 10 mm or more. The size of the third pad part 813 may be equal to that of the pad part 811, but embodiments are not limited thereto. For example, a width of the third pad part 813 may be 10 mm or more, and a length of the third pad part 813 may be 30 mm or less. However, embodiments are not limited thereto. The size of the fourth pad part 815 may be equal to that of the second pad part 812, but embodiments are not limited thereto. For example, a width of the fourth pad part 815 may be 10 mm or more, and a length of the fourth pad part 815 may be 30 mm or less. However, embodiments are not limited thereto. The size of the first pad part 811, the size of the second pad part 812, the size of the third pad part 813, and the size of the fourth pad part 815 may be similarly respectively applied to the pad part 821, the second pad part 822, the third pad part 823, and the fourth pad part 825 in the first region L.

The size of the first pad parts 811 and 821 may be greater than or equal to that of the second pad parts 812 and 822 or the fourth pad parts 815 and 825, but embodiments are not limited thereto. A length of the first pad part 811 may be equal to or longer than that of the second pad part 812 or the fourth pad part 815. For example, the length of the first pad part 811 may be 90 mm or less, and a length of the second pad part 812 may be 30 mm or less. However, embodiments are not limited thereto. The length of the first pad part 811 and the length of the second pad part 812 may be similarly respectively applied to the first pad part 821 and the second first pad part 821 or the fourth pad part 825 in the first region L.

A shape of the first pad parts 811 and 821, a shape of the second pad parts 812 and 822, a shape of the third pad parts 813 and 823, and a shape of the fourth pad parts 815 and 825 may be a tetragonal (e.g., rectangular or square) shape or a rounded-end tetragonal shape. However, the shape of the first pad parts 811 and 821, the shape of the second pad parts 812 and 822, the shape of the third pad parts 813 and 823, and the shape of the fourth pad parts 815 and 825 may be provided as various shapes, such as a circular shape. Embodiments are not limited to these examples.

A partition may be configured based on a shape of a display panel, and one or more pad parts may be provided on at least one side of the partition, thereby decreasing the wave phenomenon and reducing the peak or the dip phenomenon caused by the standing wave. Accordingly, a sound output characteristic may be enhanced. The partition and the pad parts may be formed of different materials. Thus, the occurrence of an abnormal sound may be reduced or prevented, thereby enhancing a sound output characteristic.

Figure 15A:
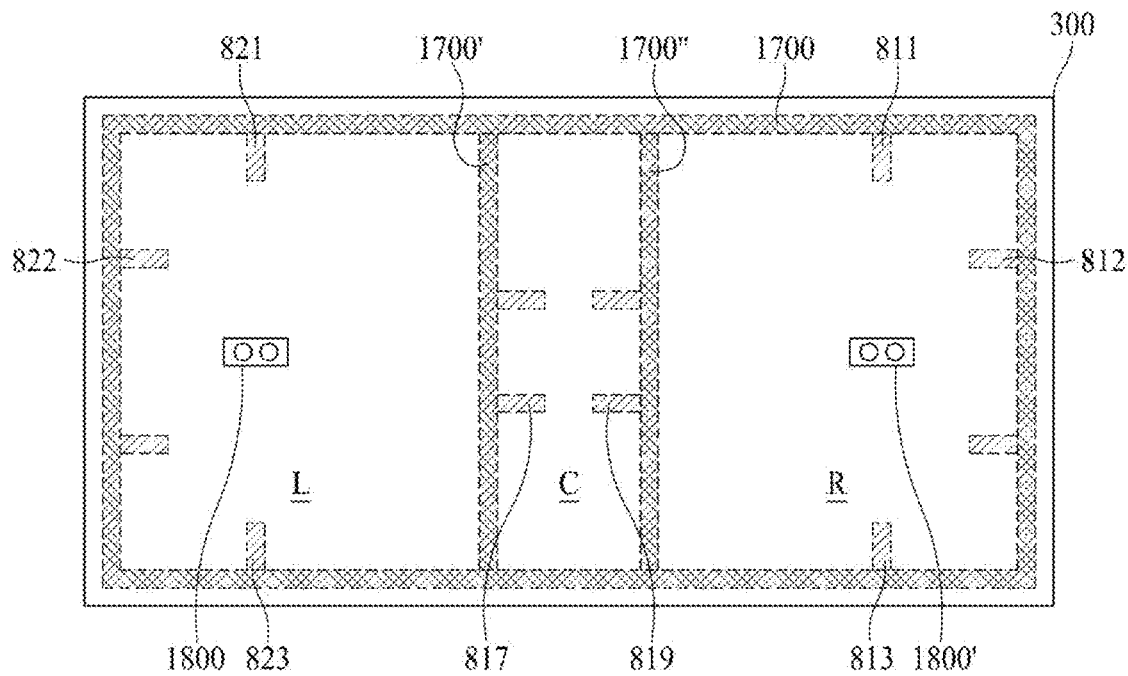
FIGS. 15A to 15C illustrate examples of a sound generation device and a partition, in a display apparatus according to an embodiment of the present disclosure.
Figure 15B:
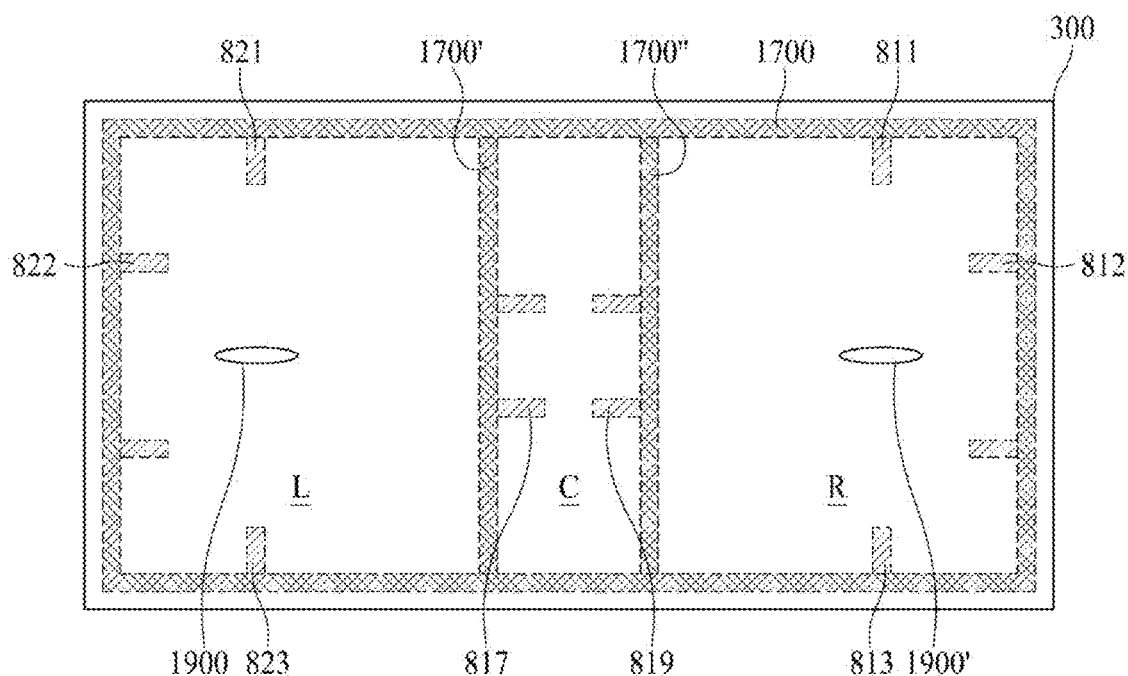

FIGS. 15A and 15B illustrate examples of a sound generation device and a partition, in a display apparatus according to an embodiment of the present disclosure.

Figure 15C:
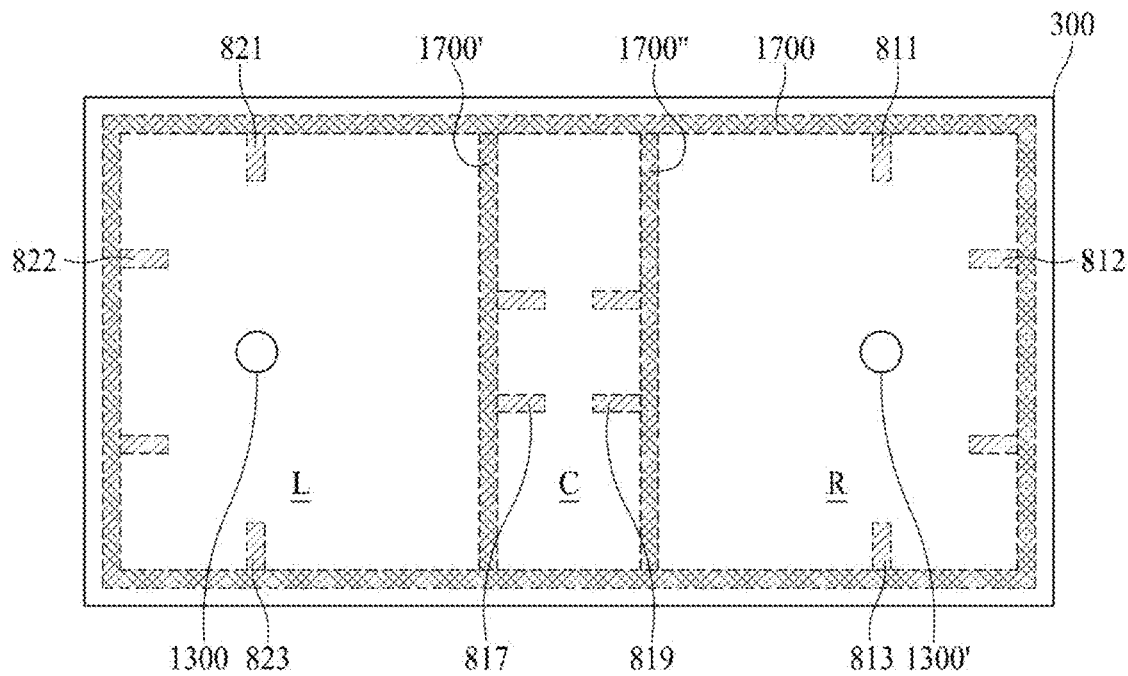

In FIGS. 15A to 15C, duplicate descriptions as descriptions given above with reference to FIGS. 13A to 13G are omitted or will be briefly provided. For example, descriptions of a sound generation device, a pad part, a second pad part, and a third pad part are omitted or will be briefly provided. A partition and a pad part will be described with reference to FIG. 15A by way of example, and the descriptions of the partition and the pad part may be similarly applied to the examples of FIGS. 15B and 15C.

With reference to FIGS. 15A to 15C, a first partition 1700 may be disposed between a display panel and a supporting member 300. For example, the first partition 1700 may be between a rear surface of the display panel and a front surface of the supporting member 300. The first partition 1700 may be on the supporting member 300. For example, the first partition 1700 may be in a periphery of the supporting member 300 or a periphery of the front surface of the supporting member 300. The first partition 1700 may be in a periphery of the display panel. For example, the first partition 1700 may be on a rear surface of the display panel or in a periphery of the supporting member 300. The first partition 1700 may be a whole or entire region of four outer sides of the supporting member or the rear surface of the display panel.

The first partition 1700 may be disposed along a shape of the display panel. For example, the first partition 1700 may have a tetragonal (e.g., rectangular or square) shape, but embodiments are not limited thereto. For example, a shape of the first partition 1700 may be modified based on a shape of the display panel. If the display panel is a curved display panel having a curved shape or curve shape, or the like, the first partition 1700 may have a correspondingly curved shape or curve shape. Accordingly, the first partition 1700 may be disposed along (or may be based on) a shape of the display panel, thereby reducing or preventing the wave phenomenon.

With reference to FIG. 15A, at least two partitions, for example, a second partition 1700″ and a third partition 1700‴, may be disposed between a first sound generation device 1800 and a second sound generation device 1800′. For example, the second partition 1700′ may be between a first region L and a third region C, and the third partition 1700″ may be between a second region R and the third region C.

The first partition 1700, the second partition 1700′, and the third partition 1700″ may be on the supporting member 300. For example, the first partition 1700, the second partition 1700′, and the third partition 1700″ may be in the periphery of the supporting member 300 or the front surface of the supporting member 300. The first partition 1700, the second partition 1700′, and the third partition 1700″ may be on the display panel or in the rear surface of the display panel or in the periphery of the display panel. The first partition 1700, the second partition 1700′, and the third partition 1700″ may be disposed between the display panel and the supporting member 300. The first partition 1700, the second partition 1700′, and the third partition 1700″ may be disposed between the display panel and the supporting member 300. For example, the first partition 1700, the second partition 1700′, and the third partition 1700″ may be disposed between the rear surface of the display panel and the front surface of the supporting member 300.

The first partition 1700, the second partition 1700′, and the third partition 1700″ may be formed of the same material. The first partition 1700, the second partition 1700′, and the third partition 1700″ may be formed of a double-sided tape, but embodiments are not limited thereto. For example, the first partition 1700, the second partition 1700′, and the third partition 1700″ may be formed of a material having an elasticity that may enable compression to be formed to some extent. For example, the first partition 1700, the second partition 1700′, and the third partition 1700″ may be formed of polyurethane, polyolefin, polyethylene, and/or the like, but embodiments are not limited thereto.

The first partition 1700, the second partition 1700′, and the third partition 1700″ may be disposed close to a periphery of a rear surface of the display panel or the periphery of the front surface of the supporting member 300, thereby reducing the wave phenomenon seen on a screen of the display panel. The first partition 1700 may be configured based on the shape of the display panel. Thus, workability may be improved when attaching the display panel to the supporting member 300 that supports the rear surface of the display panel.

A pad part may be provided on one or more sides of the first partition 1700, e.g., for decreasing the peak or the dip phenomenon caused by the standing wave that may occur in a lengthwise (or vertical) direction of the first and second sound generation devices 1800 and 1800′. For example, the first partition 1700 may include a first side and a second side perpendicular to the first side, and a plurality of first pad parts 811 and 821 may be on the first side. The first pad parts 811 and 821 may be provided as one or as a plurality. The first side may be disposed in a widthwise (or horizontal) direction of the display panel 100 or the supporting member 300. The second side may be disposed in a lengthwise (or vertical) direction of the display panel 100 or the supporting member 300.

Second pad parts 812 and 822 may be further provided on a second side of the first partition 1700. One or more second pad parts 812 and 822 may be provided on one or more sides of the first partition 1700. The second pad parts 812 and 822 may be disposed in at least one of the first region L and the second region R.

One or more pad parts may face or may be disposed toward one or more sound generation devices. For example, third pad parts 813 and 823 may be further provided on a side facing the first side of the first partition 1700. The third pad part 823 may be on the side facing the first side of the first partition 1700 in the first region L, and the third pad part 813 may be disposed on the side facing the first side of the first partition 1700 in the second region R. Also, the third pad part 813 may face the pad part 811, and the third pad part 823 may face the pad part 821. The third pad parts 813 and 823 may be provided as one or as a plurality. Therefore, the first pad parts 811 and 821, the second pad parts 812 and 822, and the third pad parts 813 and 823 may trap a reflected wave from the first and second sound generation devices 1800 and 1800′. Thus, the first pad parts 811 and 821, the second pad parts 812 and 822, and the third pad parts 813 and 823 may decrease the peak or the dip caused by the standing wave. The second pad parts 812 and 822 may further reduce the peak or the dip caused by the standing wave that may occur due to interference of a reflected wave and a progressive wave, and may avoid or prevent sound quality from being reduced by the standing wave or the reflected wave.

One or more first members 817 may be further provided on one or more sides of the second partition 1700'. One or more second members 819 may be further provided on one or more sides of the third partition 1700". The first member 817 and the second member 819 may be disposed between the second pad parts 812 and 822 or the fourth pad parts 815 and 825, and may be disposed in the third region C. The first member 817 and the second member 819 may be disposed in a widthwise (or horizontal) direction of the display panel or the supporting member 300. The first member 817 and the second member 819 may reduce or prevent vibrations generated by the first and second sound generation devices 1800 and 1800' from passing over, through, or across the second partition 1700' and the third partition 1700". Therefore, the first member 817 and the second member 819 may control a wave or a vibration, which may be transferred or spread to the first region L and/or the right region R, between the second partition 1700' and the third partition 1700". Accordingly, a display apparatus having a more enhanced sound output characteristic may be provided.

The first member 817 and the second member 819 may respectively be symmetrically or asymmetrically provided with respect to the first sound generation device 1800. For example, the first member 817 may be on, over, or under a line of the second member 819 with respect to the first sound generation device 1800, e.g., in a vertical direction. When the first member 817 and the second member 819 are provided as one body, the first member 817 and the second member 819 may be symmetrically provided with respect to the first sound generation device 1800. For example, the first member 817 and the second member 819 may be provided on the same line with respect to the first sound generation device 1800. When the first member 817 and the second member 819 are provided as one body, the first member 817 and the second member 819 may be asymmetrically provided with respect to the first sound generation device 1800. For example, with respect to the first sound generation device 1800, the first member 817 may be disposed on a same line as the first sound generation device 1800, and the second member 819 may be disposed under the first sound generation device 1800, e.g., in a vertical direction. However, embodiments are not limited thereto.

The first member 817 and the second member 819 may be formed of one or more of: a double-sided tape, a single-sided tape, an adhesive, and/or a bond, but embodiments are not limited thereto. The first member 817 and the second member 819 may be disposed in the widthwise (or horizontal) direction of the display panel. Thus, when the first member 817 and the second member 819 are formed of materials that differ from those of the second pad parts 812 and 822 or the fourth pad parts 815 and 825, the wave phenomenon may occur due to different adhesive forces when contacting the display panel. When the first member 817 and the second member 819 are formed of the same material as that of the second pad parts 812 and 822 or the fourth pad parts 815 and 825, the wave phenomenon may be reduced, and the occurrence of an abnormal sound may be reduced. For example, the first member 817 and the second member 819 may be formed of a single-sided tape. The single-sided tape may include a foam material that may absorb an impact when contacting the display panel. If the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

The first member 817 and the second member 819 may be formed of the same material as that of the first pad parts 811 and 821. The first pad parts 811 and 821, the second pad parts 812 and 822, the third pad parts 813 and 823, the first member 817, and the second member 819 may be formed of the same material. For example, the first pad parts 811 and 821, the second pad parts 812 and 822, the third pad parts 813 and 823, the first member 817, and the second member 819 may be formed of a single-sided tape. The single-sided tape may include a foam material that may absorb an impact when contacting the display panel. When the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

As a size of the first pad parts 811 and 821, a size of the second pad parts 812 and 822, and a size of the third pad parts 813 and 823 increase, it may be easier to control the peak or the dip phenomenon caused by the standing wave. For example, if a width of the first pad part 811 and a width of the second pad part 812 are less than 10 mm, it may be difficult to control the peak or the dip phenomenon caused by the standing wave. Therefore, the width of the first pad part 811 and the width of the second pad part 812 may each be 10 mm or more. The size of the third pad part 813 may be equal to that of the pad part 811, but embodiments are not limited thereto. For example, a width of the third pad part 813 may be 10 mm or more, and a length of the third pad part 813 may be 30 mm or less. However, embodiments are not limited thereto. The size of the first pad part 811, the size of the second pad part 812, and the size of the third pad part 813 may be similarly respectively applied to the pad part 821, the second pad part 822, and the third pad part 823 in the first region L.

The size of the first pad part 811 may be greater than or equal to that of the second pad part 812, but embodiments are not limited thereto. A length of the first pad part 811 may be equal to or longer than that of the second pad part 812. For example, the length of the first pad part 811 may be 90 mm or less, and a length of the second pad part 812 may be 30 mm or less. However, embodiments are not limited thereto. The length of the first pad part 811 and the length of the second pad part 812 may be similarly respectively applied to the first pad part 821 and the second pad part 822 in the first region L. A size of the first member 817 and a size of the second member 819 may be less than or equal to that of the second pad parts 812 and 822, but embodiments are not limited thereto.

A shape of the first pad parts 811 and 821, a shape of the pad parts 812 and 822, a shape of the third pad parts 813 and 823, a shape of the first member 817, and a shape of the second member 819 may be a tetragonal (e.g., rectangular or square) shape or a rounded-end tetragonal shape. However, the shape of the pad parts 911 and 921, the shape of the first pad parts 811 and 821, the shape of the third pad parts 813 and 823, the shape of the first member 817, and the shape of the second member 819 may be provided as various shapes, such as a circular shape. Embodiments are not limited to these examples.

A partition may be configured based on a shape of a display panel, and one or more pad parts may be provided on at least one side of the partition, thereby decreasing the wave phenomenon and reducing the peak or the dip phenomenon caused by the standing wave. Accordingly, a sound output characteristic may be enhanced. The partition and the pad parts may be formed of different materials. Thus, the occurrence of an abnormal sound may be reduced or prevented, thereby enhancing a sound output characteristic. A member may also be provided, thereby further enhancing a sound output characteristic.

Figure 16A:
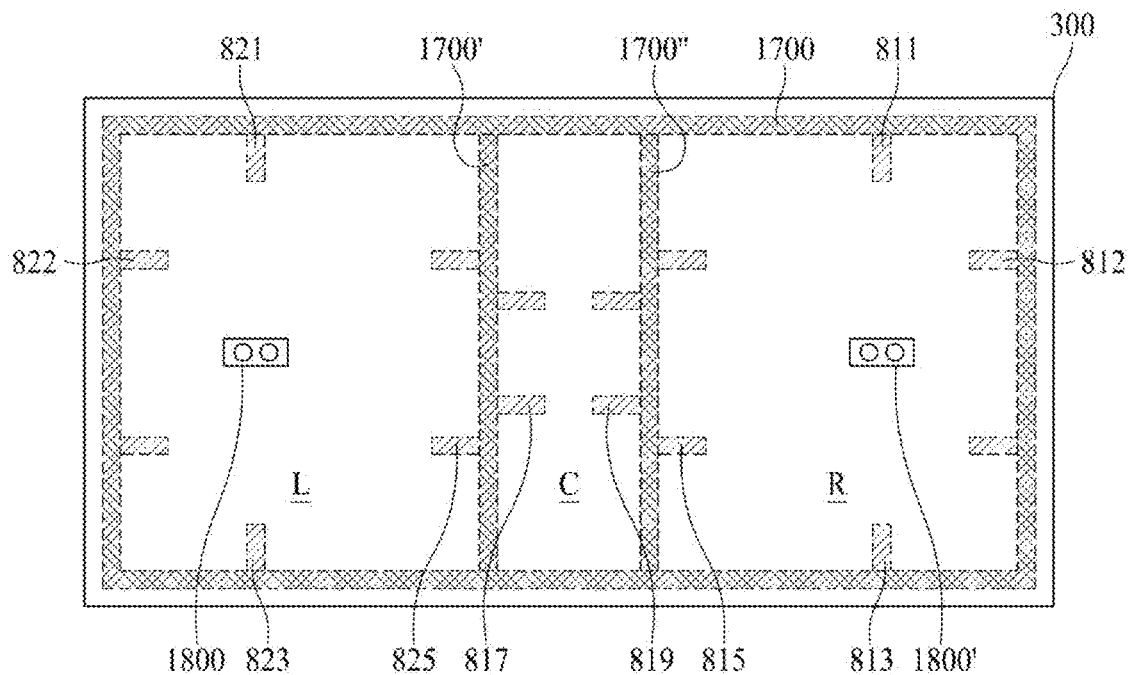
FIGS. 16A to 16C illustrate examples of a sound generation device and a partition, in a display apparatus according to an embodiment of the present disclosure.
Figure 16B:
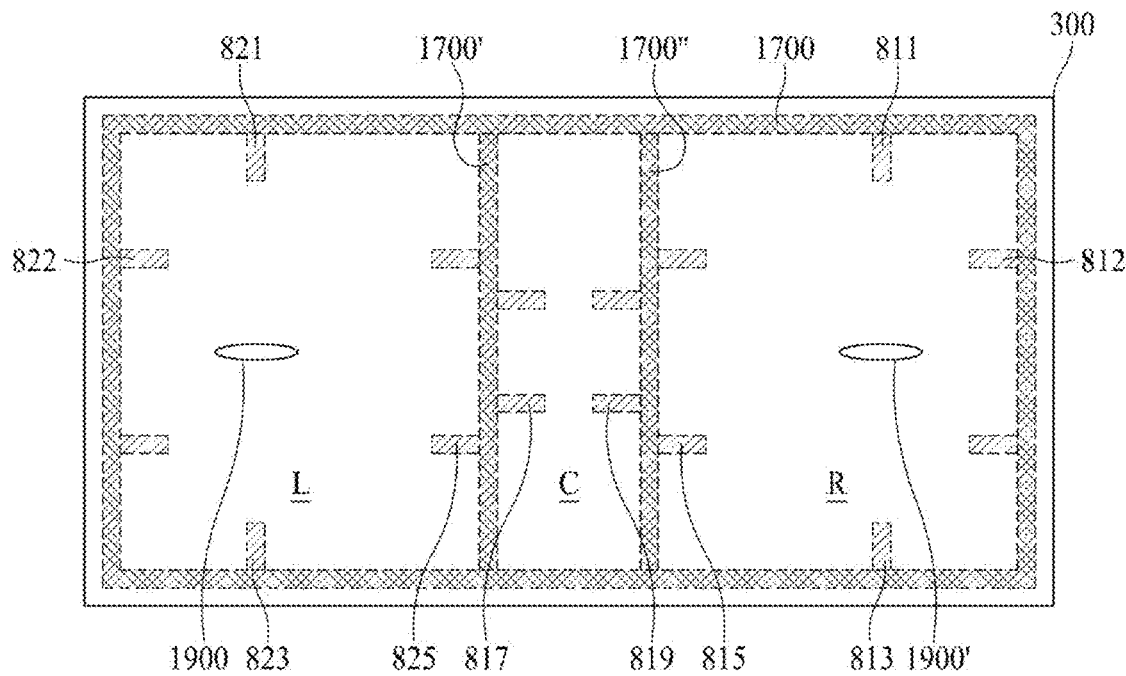
Figure 16C:
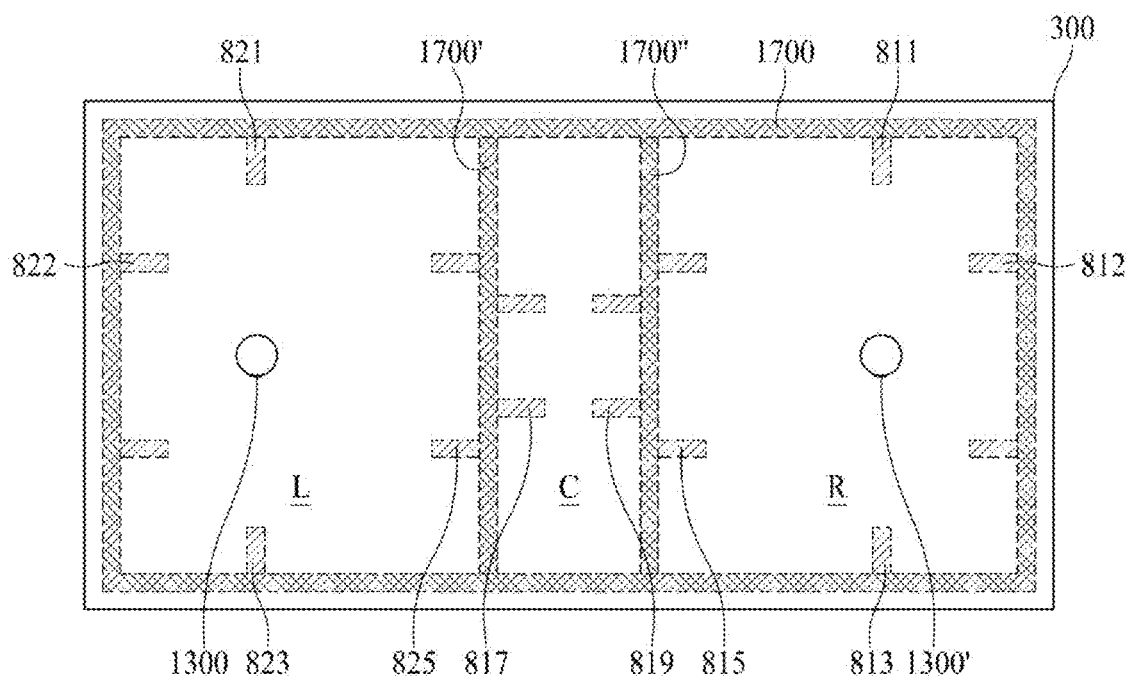

FIGS. 16A to 16C illustrate examples of a sound generation device and a partition, in a display apparatus according to an embodiment of the present disclosure.

In FIGS. 16A to 16C, duplicate descriptions to those given above with reference to the examples of FIGS. 13A to 13G are omitted or will be briefly provided. For example, descriptions of a sound generation device, a pad part, a second pad part, and a third pad part are omitted or will be briefly provided. Also, a partition and a pad part will be described with reference to FIG. 16A by way of example, and the descriptions of the partition and the pad part may be similarly applied to the examples of FIGS. 16B and 16C.

With reference to FIGS. 16A to 16C, a first partition 1700 may be disposed between a display panel and a supporting member 300. For example, the first partition 1700 may be between a rear surface of the display panel and a front surface of the supporting member 300. The first partition 1700 may be on the supporting member 300. For example, the first partition 1700 may be in the periphery of the supporting member 300 or a periphery of the front surface of the supporting member 300. The first partition 1700 may be in a periphery of the display panel. For example, the first partition 1700 may be on a rear surface of the display panel or in a periphery of the supporting member 300. The first partition 1700 may be a whole or entire region of four outer sides of the supporting member or the rear surface of the display panel.

The first partition 1700 may be disposed along or based on a shape of the display panel. For example, the first partition 1700 may have a tetragonal (e.g., rectangle or square) shape, but embodiments are not limited thereto. For example, a shape of the first partition 1700 may be modified based on a shape of the display panel. If the display panel is a curved display panel having a curved shape or curve shape, or the like, the first partition 1700 may have a correspondingly curved shape or curve shape. Accordingly, the first partition 1700 may be disposed along or based on a shape of the display panel, thereby reducing or preventing the wave phenomenon.

With reference to FIG. 16A, at least two partitions, for example, a second partition 1700' and a third partition 1700", may be disposed between a first sound generation device 1800 and a second sound generation device 1800'. For example, the second partition 1700' may be between a first region L and a third region C, and the third partition 1700" may be between a second region R and the third region C.

The first partition 1700, the second partition 1700', and the third partition 1700" may be disposed between the display panel and the supporting member 300. For example, the first partition 1700, the second partition 1700', and the third partition 1700" may be between the rear surface of the display panel and the front surface of the supporting member 300. The first partition 1700, the second partition 1700', and the third partition 1700" may be on the supporting member 300. The first partition 1700, the second partition 1700', and the third partition 1700" may be on the display panel 100.

The first partition 1700, the second partition 1700', and the third partition 1700" may be formed of a double-sided tape, but embodiments are not limited thereto. For example, the first partition 1700, the second partition 1700', and the third partition 1700" may be formed of a material having an elasticity that may enable compression to be formed to some extent. For example, the first partition 1700, the second partition 1700', and the third partition 1700" may be formed of polyurethane, polyolefin, polyethylene, and/or the like, but embodiments are not limited thereto.

The first partition 1700, the second partition 1700', and the third partition 1700" may be disposed close to the periphery of the rear surface of the display panel or the periphery of the front surface of the supporting member 300, thereby reducing the wave phenomenon seen on a screen of the display panel. The first partition 1700 may be configured based on the shape of the display panel. Thus, workability may be improved when attaching the display panel to the supporting member 300 that supports the rear surface of the display panel.

A pad part may be provided on one or more sides of the first partition 1700, e.g., for decreasing the peak or the dip phenomenon caused by the standing wave that may occur in a lengthwise (or vertical) direction of the first and second sound generation devices 1800 and 1800'. For example, the first partition 1700 may include a first side and a second side perpendicular to the first side, and a plurality of first pad parts 811 and 821 may be on the first side. The first pad parts 811 and 821 may be provided as one or as a plurality. The first side may be disposed in a widthwise (or horizontal) direction of the display panel or the supporting member 300, and the second side may be disposed in a lengthwise (or vertical) direction of the display panel or the supporting member 300.

A plurality of second pad parts 812 and 822 may be further provided on a second side of the first partition 1700. One or more second pad parts 812 and 822 may be on one or more sides of the first partition 1700. The second pad parts 812 and 822 may be in at least one of the first region L and the second region R.

One or more pad parts may face or may be disposed toward one or more sound generation devices. For example, a plurality of third pad parts 813 and 823 may be further provided on a side facing the first side of the first partition 1700. For example, the third pad part 823 may be on a side facing the first side of the first partition 1700 in the first region L, and the third pad part 813 may be on a side facing the first side of the first partition 1700 in the second region R. The third pad part 813 may face the pad part 811, and the third pad part 823 may face the pad part 821. The third pad parts 813 and 823 may be provided as one or as a plurality.

One or more fourth pad parts 815 and 825 may be further provided on a side facing the second side of the first partition 1700. For example, the fourth pad part 825 may be on a side facing the second side of the first partition 1700 in the first region L, and the fourth pad part 815 may be on a side facing the second side of the first partition 1700 in the second region R. The fourth pad part 825 may face the second pad part 822, and the fourth pad part 815 may face the second pad part 812. The fourth pad parts 815 and 825 may be provided as one or as a plurality. The first pad parts 811 and 821, the second pad parts 812 and 822, the third pad parts 813 and 823, and the fourth pad parts 815 and 825 may trap a reflected wave from the first and second sound generation devices 1800 and 1800'. Thus, first pad parts 811 and 821, the second pad parts 812 and 822, the third pad parts 813 and 823, and the fourth pad parts 815 and 825 may decrease the peak or the dip phenomenon caused by the standing wave. Also, the second pad parts 812 and 822 and the fourth pad parts 815 and 825 may further reduce the peak or the dip phenomenon caused by the standing wave that may occur due to interference of a reflected wave and a progressive wave, and may avoid or prevent sound quality from being reduced by the standing wave or the reflected wave.

The fourth pad parts 815 and 825 may be formed of one or more of: a double-sided tape, a single-sided tape, an adhesive, and a bond, but embodiments are not limited thereto. The fourth pad parts 815 and 825 may face the second pad parts 812 and 822. Thus, when the fourth pad parts 815 and 825 are formed of materials that differ from those of the second pad parts 812 and 822, the wave phenomenon may occur due to different adhesive forces when the fourth pad parts 815 and 825 contact the display panel. Therefore, when the fourth pad parts 815 and 825 are formed of the same material as that of the second pad parts 812 and 822, the wave phenomenon may be reduced, and the occurrence of an abnormal sound may be reduced. The fourth pad parts 815 and 825 may be formed of, for example, a single-sided tape. The single-sided tape may include a foam material that may absorb an impact when contacting the display panel. When the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

Therefore, the one or more first pad parts 811 and 821 may be formed of the same material as that of at least one of the one or more second pad parts 812 and 822, the one or more third pad parts 813 and 823, and the one or more fourth pad parts 815 and 825. The one or more first pad parts 811 and 821, the one or more second pad parts 812 and 822, the one or more third pad parts 813 and 823, and the one or more fourth pad parts 815 and 825 may be formed of the same material. Embodiments are not limited to these examples.

One or more first members 817 may be further provided on one or more sides of the second partition 1700'. One or more second members 819 may be further provided on one or more sides of the third partition 1700". The first member 817 and the second member 819 may be between the second pad parts 812 and 822, or may be between the fourth pad parts 815 and 825. The first member 817 and the second member 819 may reduce or prevent vibrations generated by the first and second sound generation devices 1800 and 1800' from passing over, through, or across the second partition 1700' and the third partition 1700". Therefore, the first member 817 and the second member 819 may control a wave or a vibration, which may be transferred or spread to the first region L and/or the right region R, between the second partition 1700' and the third partition 1700". Accordingly, a display apparatus having a more enhanced sound output characteristic may be provided.

The first member 817 and the second member 819 may respectively be symmetrically or asymmetrically provided with respect to the first sound generation device 1800. For example, the first member 817 may be on, over, or under the same line as the second member 819 with respect to the first sound generation device 1800, e.g., in a vertical direction. When the first member 817 and the second member 819 are provided as one body, the first member 817 and the second member 819 may be symmetrically provided with respect to the first sound generation device 1800. For example, the first member 817 and the second member 819 may be provided on the same line with respect to the first sound generation device 1800. When the first member 817 and the second member 819 are provided as one body, the first member 817 and the second member 819 may be asymmetrically provided with respect to the first sound generation device 1800. For example, with respect to the first sound generation device 1800, the first member 817 may be on the same line as the first sound generation device 1800, and the second member 819 may be under the first sound generation device 1800, e.g., in a vertical direction.

The first member 817 and the second member 819 may be formed of the same material as that of the first pad parts 811 and 821. The first pad parts 811 and 821, the second pad parts 812 and 822, the third pad parts 813 and 823, the fourth pad parts 815 and 825, the first member 817, and the second member 819 may be formed of the same material. For example, the first pad parts 811 and 821, the second pad parts 812 and 822, the third pad parts 813 and 823, the fourth pad parts 815 and 825, the first member 817, and the second member 819 may be formed of a single-sided tape. The single-sided tape may include a foam material that may absorb an impact when contacting the display panel. When the single-sided tape does not include the foam material, an undesired abnormal sound may occur due to contacting the display panel. The single-sided tape may be formed of, for example, polyurethane, polyolefin, polyethylene, and/or the like, but embodiments are not limited thereto.

As a size of the first pad parts 811 and 821, a size of the second pad parts 812 and 822, a size of the third pad parts 813 and 823, and a size of the fourth pad parts 815 and 825 increase, it may be easier to control the peak or the dip phenomenon caused by the standing wave. For example, if a width of the first pad part 811 and a width of the second pad part 812 are less than 10 mm, it may be difficult to control the peak or the dip phenomenon caused by the standing wave. Therefore, the width of the first pad part 811 and the width of the second pad part 812 may each be 10 mm or more. The size of the third pad part 813 may be equal to that of the first pad part 811, but embodiments are not limited thereto. For example, a width of the third pad part 813 may be 10 mm or more, and a length of the third pad part 813 may be 30 mm or less. However, embodiments are not limited thereto. The size of the fourth pad part 815 may be equal to that of the second pad part 812, but embodiments are not limited thereto. For example, a width of the fourth pad part 815 may be 10 mm or more, and a length of the fourth pad part 815 may be 30 mm or less. However, embodiments are not limited thereto. The size of the first pad part 811, the size of the second pad part 812, the size of the third pad part 813, and the size of the fourth pad part 815 may be similarly respectively applied to the pad part 821, the second pad part 822, the third pad part 823, and the fourth pad part 825 in the first region L.

The size of the first pad parts 811 and 821 may be greater than or equal to that of the second pad parts 812 and 822 or the fourth pad parts 815 and 825, but embodiments are not limited thereto. A length of the first pad part 811 may be equal to or longer than that of the second pad part 812 or the fourth pad part 815. For example, the length of the first pad part 811 may be 90 mm or less, and a length of the second pad part 812 may be 30 mm or less. However, embodiments are not limited thereto. The length of the first pad part 811, the length of the second pad part 812, and the length of the fourth pad part 815 may be similarly respectively applied to the pad part 821, the second pad part 821, and the fourth pad part 825 in the first region L.

A shape of the first pad parts 811 and 821, a shape of the second pad parts 812 and 822, a shape of the third pad parts 813 and 823, a shape of the fourth pad parts 815 and 825, a shape of the first member 817, and a shape of the second member 819 may be a tetragonal (e.g., rectangular or square) shape or a rounded-end tetragonal shape. However, the shape of the first pad parts 811 and 821, the shape of the second pad parts 812 and 822, the shape of the third pad parts 813 and 823, the shape of the fourth pad parts 815 and 825, the shape of the first member 817, and the shape of the second member 819 may be provided as various shapes, such as a circular shape. Embodiments are not limited to these examples.

A partition may be configured based on a shape of a display panel, and one or more pad parts may be provided on at least one side of the partition, thereby decreasing the wave phenomenon and reducing the peak or the dip phenomenon caused by the standing wave. Accordingly, a sound output characteristic may be enhanced. The partition and the pad parts may be formed of different materials. Thus, the occurrence of an abnormal sound may be prevented, thereby enhancing a sound output characteristic. A member may also be provided, thereby further enhancing a sound output characteristic.

A vibration characteristic has been measured with a laser Doppler device. A result of the measurement will be described below with reference to FIG. 17.

Figure 17:
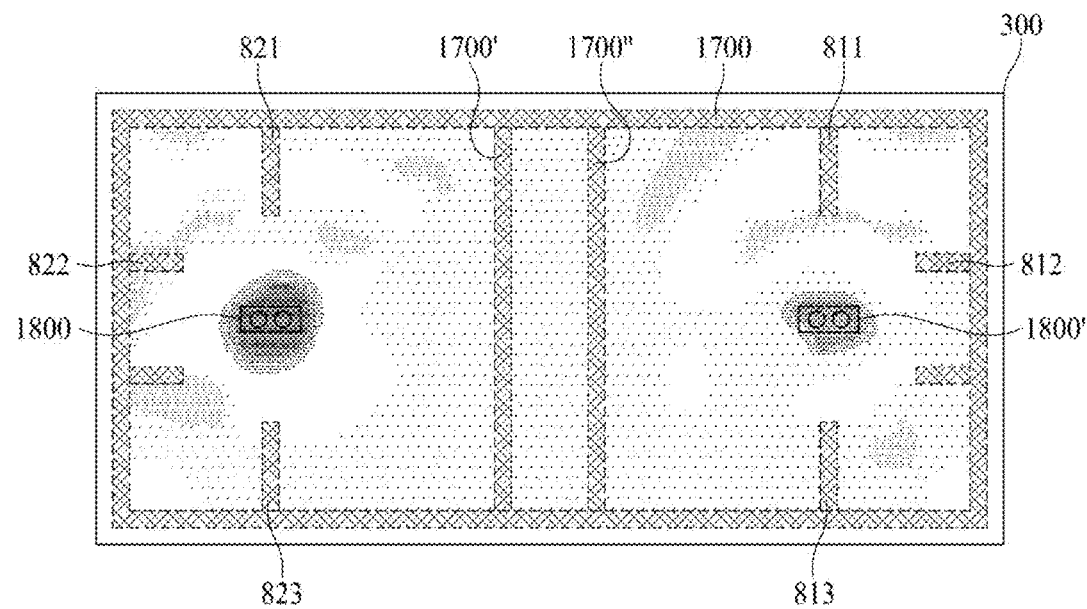
FIG. 17 illustrates a vibration characteristic of a sound generation device according to an embodiment of the present disclosure.

FIG. 17 illustrates a vibration characteristic of a sound generation device according to an embodiment of the present disclosure.

FIG. 17 shows an experimental result obtained by measuring a vibration characteristic with the laser Doppler device. The laser Doppler device may irradiate laser light onto a sound vibration surface of a display panel and may check (or test) a scattered pattern of the laser light to check (or determine) a shape in which a vibration spreads, and the checked shape may be displayed as an image. A microphone, through which a sound may be input, is disposed at a center of the display panel, and the measurement has been performed in a state in which a sound travels to the center of the display panel.

Measurement has been performed under a condition in which a size of the first pad parts 811 and 821 is greater than that of the second pad parts 812 and 822, but embodiments are not limited thereto. For example, a result of the measurement may be the same as a result of measurement performed under a condition in which a size of the first pad parts 811 and 821 is equal to that of the second pad parts 812 and 822.

As illustrated in FIG. 17, measurement has been performed under a condition in which a partition and a pad part are provided in a supporting member 300. Moreover, a result of the measurement may be the similar to a result of measurement that is performed under a condition in which the partition and a pad part are provided on a rear surface of the display panel. Also, measurement has been performed under a condition in which a pair of sound generation devices is provided, but a result of the measurement may be the same as a result of measurement performed under a condition in which a circular or oval sound generation device is provided.

In FIG. 17, a portion shown as dark or black represents a portion where a vibration is large, and a blurry or grey portion represents a portion where a vibration is small. Lighter grey indicates less vibration. For example, when a vibration occurs in a first sound generation device 1800 and a second sound generation device 1800', a portion shown as dark or black forms a concentric shape, e.g., a circle, and the vibration spreads to a periphery and flows out to the outside. When a larger vibration subsequently occurs, a color of a slightly blurry (e.g., lighter grey) portion and a blurry (e.g., darker grey) portion is changed to dark or black. Also, as time elapses, a slightly blurry (e.g., lighter grey) portion is changed to a blurry (e.g., darker grey) portion where a vibration has been increased. In other words, when the vibration is continuously applied over a long time, the vibration increases throughout the first region L and second region R respectively surrounded by the first partition 1700 and the second partition 1700'.

Based on the experimental result obtained by measuring the vibration characteristic with the laser Doppler device, it can be seen that a vibration occurs in the first sound generation device 1800 provided in a first region L and the second sound generation device 1800' provided in a second region R. For example, it can be seen that a uniform vibration occurs in the first sound generation device 1800 provided in the first region L and the second sound generation device 1800' provided in the second region R. However, no vibration was measured in the third (center) area C. A sound output characteristic according to an embodiment of the present disclosure has been measured, and a result of the measurement will be described below with reference to FIG. 18.

Figure 18:
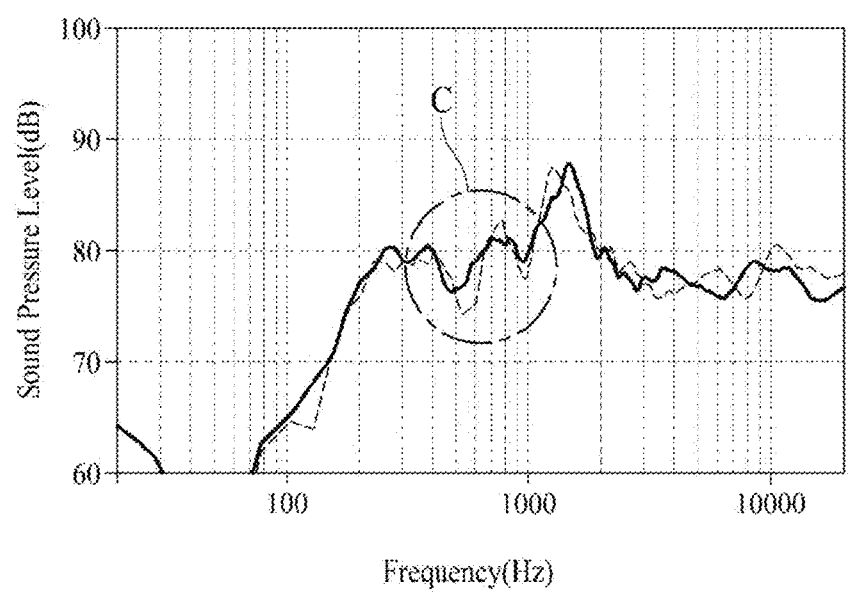
FIG. 18 illustrates a sound output characteristic of a sound generation device according to an embodiment of the present disclosure.

FIG. 18 illustrates a sound output characteristic of a sound generation device according to an embodiment of the present disclosure.

In FIG. 18, a dotted line shows a sound output characteristic of the sound generation device of the example of FIG. 9B, and a solid line shows a sound output characteristic of the sound generation device of the example of FIG. 13A. The abscissa (or horizontal) axis represents a frequency (Hz), and the ordinate (or vertical) axis represents a sound pressure level (SPL) in decibels (dB).

In FIG. 18, experimental measurements were performed under a condition in which a partition and a pad part are provided on a supporting member, and a result of the measurement may be substantially similar to a result of measurement performed under a condition in which the partition and a pad part are provided on a rear surface of a display panel. Measurement has been performed under a condition in which a pair of sound generation devices is provided, but a result of the measurement may be substantially similar to a result of measurement performed under a condition in which a circular or oval sound generation device is provided.

With reference to FIG. 18, in an example (shown by a dotted line) in which the sound generation device illustrated in FIG. 9B is applied, it can be seen that in a frequency of about 400 Hz to 1 kHz (referred to by the circle "C"), because the occurrence of the specific frequency is reduced, a dip where a sound pressure level is low is shown as being severe. When the sound generation device of the FIG. 13A example (shown by a solid line) is applied, it can be seen that the dip and the peak at C are reduced.

Evenness is a difference between a highest point and a lowest point of a sound pressure level in a frequency characteristic. As the difference is reduced, evenness of a sound improves, and a sound characteristic can be improved. As the number of peaks and dips causing the difference is reduced, the sound characteristic can be improved. In the display apparatus according to an embodiment of the present disclosure, it can be seen that a sound having the low sound band at "C" is improved. Therefore, in an embodiment of the present disclosure, when the pad part is provided in the partition, the number of the dips or peaks may be reduced. Thus, an evenness of a sound may be improved.

Therefore, the display apparatus according to an embodiment of the present disclosure may realize a sound characteristic for which the dip or the peak is reduced. Thus, an even sound characteristic may be realized. Accordingly, a display apparatus having a more enhanced sound output characteristic may be provided.

The sound generation device according to an embodiment of the present disclosure may be provided as a sound generation device provided in a display apparatus. The display apparatus according to an embodiment of the present disclosure may be applied, for example, to mobile apparatuses, video phones, smart watches, watch phones, wearable apparatuses, foldable devices, rollable apparatuses, bendable apparatuses, flexible apparatuses, curved apparatuses, portable multimedia players (PMPs), personal digital assistants (PDAs), electronic organizers, desktop personal computers (PCs), laptop PCs, netbook computers, workstations, navigation apparatuses, automotive navigation apparatuses, automotive display apparatuses, televisions (TVs), wall paper display apparatuses, signage apparatuses, game machines, notebook computers, monitors, cameras, camcorders, home appliances, etc. The sound generation device according to an embodiment of the present disclosure may be applied to organic light-emitting lighting apparatuses or inorganic light-emitting lighting apparatuses. When the sound generation device is applied to a lighting apparatus, the sound generation device may act as both lighting and a speaker.

A display apparatus according to an embodiment of the present disclosure will be described below.

According to an embodiment of the present disclosure, a display apparatus may include: a display panel configured to display an image, one or more sound generation devices configured to vibrate the display panel to generate sound, a supporting member configured to support the display panel, a partition between the display panel and the supporting member, the partition including: a first side in a horizontal direction, and a second side in a vertical direction, and one or more first pad parts on the first side.

For example, in the display apparatus according to an embodiment of the present disclosure, the one or more first pad parts extend toward the one or more sound generation devices. For example, the display apparatus according to an embodiment of the present disclosure may further include one or more second pad parts on the second side.

For example, in the display apparatus according to an embodiment of the present disclosure, the one or more first pad parts include a same material as the one or more second pad parts. For example, in the display apparatus according to an embodiment of the present disclosure, the one or more first pad parts and the one or more second pad parts may respectively include a single-sided tape. For example, in the display apparatus according to an embodiment of the present disclosure, a size of the one or more first pad parts may be greater than or equal to a size of the one or more second pad parts.

For example, in the display apparatus according to an embodiment of the present disclosure, the partition may have a perimeter shape corresponding to a perimeter shape of the display panel. For example, in the display apparatus according to an embodiment of the present disclosure, the partition may be configured to divide the display panel and may include portions respectively extending in a first direction of the display panel or the supporting member, or in a second direction perpendicular to the first direction. For example, in the display apparatus according to an embodiment of the present disclosure, the partition may include a different material from a material of the one or more first pad parts.

For example, the display apparatus according to an embodiment of the present disclosure may further include one or more third pad parts on a third side opposite the first side. For example, in the display apparatus according to an embodiment of the present disclosure, one of the one or more first pad parts and one of the one or more third pad parts may extend toward each other, with one of the one or more sound generation devices therebetween. For example, the display apparatus according to an embodiment of the present disclosure may further include one or more fourth pad parts on a side opposite the second side. For example, in the display apparatus according to an embodiment of the present disclosure, each of the one or more sound generation devices may include one or more of: a circular shape, an oval shape, and a pair of sound generation devices.

According to an embodiment of the present disclosure, a display apparatus may include: a display panel configured to display an image, the display panel including a first region, a second region, and a third region, one or more sound generation devices in at least one of: the first region, the second region, and the third region, a supporting member configured to support the display panel, a first partition between the display panel and the supporting member, the first partition including: a first side in a horizontal direction, and a second side in a vertical direction, and one or more first pad parts on the first side.

For example, in the display apparatus according to an embodiment of the present disclosure, the first region may be a left region of the display panel, the second region may be a right region of the display panel, the third region may be a center region of the display panel, and the one or more first pad parts may be in at least one of: the first region, the second region, and the third region. For example, in the display apparatus according to an embodiment of the present disclosure, the first partition may have a perimeter shape corresponding to a perimeter shape of the display panel. For example, in the display apparatus according to an embodiment of the present disclosure, the first partition may be configured to divide the display panel, and may include portions respectively extending: in a first direction of the display panel or the supporting member, or in a second direction perpendicular to the first direction.

For example, in the display apparatus according to an embodiment of the present disclosure, the first partition may include a double-sided tape, and each of the one or more first pad parts may include a single-sided tape. For example, in the display apparatus according to an embodiment of the present disclosure, one of the one or more first pad parts may be in the first region, and another of the one or more first pad parts may be in the second region.

For example, the display apparatus according to an embodiment of the present disclosure may further include one or more second pad parts on the second side. For example, the display apparatus according to an embodiment of the present disclosure may further include one or more third pad parts on a third side opposite the first side. For example, in the display apparatus according to an embodiment of the present disclosure, one of the one or more first pad parts, one of the one or more third pad parts, and one of the one or more sound generation devices may be disposed along a same line.

For example, the display apparatus according to an embodiment of the present disclosure may further include one or more second pad parts on the second side, and one or more third pad parts on a third side opposite the first side. For example, in the display apparatus according to an embodiment of the present disclosure, the one or more first pad parts may include a same material as a material of at least one of: the one or more second pad parts and the one or more third pad parts.

For example, the display apparatus according to an embodiment of the present disclosure may further include one or more second pad parts on the second side, one or more third pad parts on a third side opposite the first side, and one or more fourth pad parts on a fourth side opposite the second side. For example, in the display apparatus according to an embodiment of the present disclosure, the one or more first pad parts include a same material as a material of at least one of: the one or more second pad parts, the one or more third pad parts, and the one or more fourth pad parts.

For example, the display apparatus according to an embodiment of the present disclosure may further include a second partition between the first region and the third region, and a third partition between the second region and the third region, and the first region may be a left region of the display panel, the second region may be a right region of the display panel, and the third region may be a center region of the display panel. For example, the display apparatus according to an embodiment of the present disclosure may further include one or more first members on at least one side of the second partition, and one or more second members on at least one side of the third partition. For example, in the display apparatus according to an embodiment of the present disclosure, the one or more first members and the one or more second members may include a same material as a material of the one or more first pad parts. For example, in the display apparatus according to an embodiment of the present disclosure, the first partition, the second partition, and the third partition include a same material.

For example, in the display apparatus according to an embodiment of the present disclosure, the first region may be a left region of the display panel, the second region may be a right region of the display panel, the third region may be a center region of the display panel, and each of an area of the first region and an area of the second region may be greater than an area of the third region.

For example, in the display apparatus according to an embodiment of the present disclosure, one of the one or more sound generation devices may be in the first region, and another of the one or more sound generation devices may be in the second region. For example, in the display apparatus according to an embodiment of the present disclosure, the one or more sound generation devices may be configured to vibrate the display panel to generate sound. For example, in the display apparatus according to an embodiment of the present disclosure, each of the one or more sound generation devices may include one or more of: a circular shape, an oval shape, and a pair of sound generation devices.

The display apparatus according to an embodiment of the present disclosure may include the partition and the one or more pad parts on the at least one side of the partition, and the partition may be formed of a material that differs from that of the pad parts, thereby decreasing the wave phenomenon of the display panel and reducing or preventing the occurrence of an abnormal sound. Accordingly, a sound output characteristic may be enhanced.

When the display apparatus according to an embodiment of the present disclosure includes the sound generation device that may vibrate the display panel to generate sound, a speaker may not be additionally provided. Thus, a degree of freedom in design and spatial disposition of a set device or a set apparatus may be enhanced.

In the display apparatus according to an embodiment of the present disclosure, when the partition is configured based on a shape of the display panel, a wave phenomenon of the display panel may be reduced. When the display apparatus according to an embodiment of the present disclosure includes one or more pad parts on at least one side of the partition, sound quality may be improved or prevented from being reduced by a standing wave or a reflected wave that may occur in the display panel, thereby providing a display apparatus having an enhanced sound output characteristics.

When the display apparatus according to an embodiment of the present disclosure includes the partition and the one or more pad parts on the at least one side of the partition, sound quality may be improved or prevented from being reduced by the standing wave or the reflected wave that may occur in the display panel, thereby providing a display apparatus having an enhanced sound output characteristic. When the display apparatus according to an embodiment of the present disclosure includes the partition and the one or more pad parts on the at least one side of the partition, the peak and the dip phenomenon caused by the standing wave may be reduced, thereby providing a display apparatus having an enhanced sound output characteristic and a thin thickness.

In the display apparatus according to an embodiment of the present disclosure, when the partition is configured based on a shape of the display panel and the one or more pad parts are on the at least one side of the partition, the wave phenomenon, which is a defect that may occur in the display panel, may be reduced, and the peak and the dip phenomenon caused by the standing wave may be reduced. Accordingly, a display apparatus having an enhanced sound output characteristic may be implemented.

In the display apparatus according to an embodiment of the present disclosure, the partition may be configured based a shape of the display panel, the one or more pad parts may be provided on the at least one side of the partition, and the one or more members may be provided on at least one side of the partition. Accordingly, a display apparatus having an enhanced sound output characteristic and reducing the wave phenomenon of the display panel may be implemented.

In the display apparatus according to an embodiment of the present disclosure, when the partition is provided between one or more sound generation devices on the display panel, the partition may separate a sound. Thus, a stereo sound may be realized. Accordingly, a display apparatus having an enhanced sound output characteristic may be implemented.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. A display apparatus, comprising:
   a display panel configured to display an image;
   one or more sound generation devices configured to vibrate the display panel to generate sound, the one or more sound generation devices being on a rear surface of the display panel;
   a supporting member configured to support the display panel, the supporting member being attached on the rear surface of the display panel;

a partition between the rear surface of the display panel and the supporting member, the partition surrounding a space in which the sound is generated by the one or more sound generation devices, the partition comprising:
  a first side in a horizontal direction; and
  a second side in a vertical direction; and
one or more first pad parts on the first side of the partition, the one or more first pad parts between the rear surface of the display panel and the supporting member, and
wherein the one or more sound generation devices and partition are on a same surface of the rear surface of the display panel.

2. The display apparatus of claim 1, wherein the one or more first pad parts extend toward the one or more sound generation devices.

3. The display apparatus of claim 1, further comprising one or more second pad parts on the second side.

4. The display apparatus of claim 3, wherein the one or more first pad parts comprise a same material as the one or more second pad parts.

5. The display apparatus of claim 3, wherein the one or more first pad parts and the one or more second pad parts respectively comprise a single-sided tape.

6. The display apparatus of claim 3, wherein a size of the one or more first pad parts is greater than or equal to a size of the one or more second pad parts.

7. The display apparatus of claim 1, wherein the partition has a perimeter shape corresponding to a perimeter shape of the display panel.

8. The display apparatus of claim 1, wherein the partition is configured to divide the display panel and includes portions respectively extending:
  in a first direction of the display panel or the supporting member; or
  in a second direction perpendicular to the first direction.

9. The display apparatus of claim 1, wherein the partition comprises a different material from a material of the one or more first pad parts.

10. The display apparatus of claim 1, further comprising one or more second pad parts on a third side opposite the first side.

11. The display apparatus of claim 10, wherein one of the one or more first pad parts and one of the one or more second pad parts extend toward each other, with one of the one or more sound generation devices therebetween.

12. The display apparatus of claim 1, further comprising one or more second pad parts on a side opposite the second side.

13. The display apparatus of claim 1, wherein:
  each of the one or more sound generation devices is overlapped by a display area of the display panel in a plan view; and
  each of the one or more sound generation devices includes one or more of: a circular shape, an oval shape, and a pair of sound generation devices.

14. A display apparatus, comprising:
a display panel configured to display an image, the display panel comprising a first region, a second region, and a third region;
one or more sound generation devices in at least one of: the first region, the second region, and the third region, the one or more sound generation devices being on a rear surface of the display panel;
a supporting member configured to support the display panel, the supporting member being attached on the rear surface of the display panel;
a first partition between the rear surface of the display panel and the supporting member, the first partition surrounding a space in which the sound is generated by the one or more sound generation devices, the first partition comprising:
  a first side in a horizontal direction; and
  a second side in a vertical direction; and
one or more first pad parts on the first side of the first partition, the one or more first pad parts between the rear surface of the display panel and the supporting member, and
wherein the one or more sound generation devices and the first partition are on a same surface of the rear surface of the display panel.

15. The display apparatus of claim 14, wherein:
the first region is a left region of the display panel;
the second region is a right region of the display panel;
the third region is a center region of the display panel; and
the one or more first pad parts are in at least one of: the first region, the second region, and the third region.

16. The display apparatus of claim 14, wherein the first partition has a perimeter shape corresponding to a perimeter shape of the display panel.

17. The display apparatus of claim 14, wherein the first partition is configured to divide the display panel and includes portions respectively extending:
  in a first direction of the display panel or the supporting member; or
  in a second direction perpendicular to the first direction.

18. The display apparatus of claim 14, wherein:
the first partition comprises a double-sided tape; and
each of the one or more first pad parts comprises a single-sided tape.

19. The display apparatus of claim 14, wherein:
one of the one or more first pad parts is in the first region; and
another of the one or more first pad parts is in the second region.

20. The display apparatus of claim 14, further comprising one or more second pad parts on the second side.

21. The display apparatus of claim 14, further comprising one or more second pad parts on a third side opposite the first side.

22. The display apparatus of claim 21, wherein one of the one or more first pad parts, one of the one or more second pad parts, and one of the one or more sound generation devices are disposed along a same line.

23. The display apparatus of claim 14, further comprising:
one or more second pad parts on the second side; and
one or more third pad parts on a third side opposite the first side.

24. The display apparatus of claim 23, wherein the one or more first pad parts comprise a same material as a material of at least one of: the one or more second pad parts and the one or more third pad parts.

25. The display apparatus of claim 14, further comprising:
one or more second pad parts on the second side;
one or more third pad parts on a third side opposite the first side; and
one or more fourth pad parts on a fourth side opposite the second side.

26. The display apparatus of claim 25, wherein the one or more first pad parts comprise a same material as a material of at least one of: the one or more second pad parts, the one or more third pad parts, and the one or more fourth pad parts.

27. The display apparatus of claim 14, further comprising:
a second partition between the first region and the third region; and
a third partition between the second region and the third region,
wherein:
the first region is a left region of the display panel,
the second region is a right region of the display panel, and
the third region is a center region of the display panel.

28. The display apparatus of claim 27, further comprising:
one or more first members on at least one side of the second partition; and
one or more second members on at least one side of the third partition.

29. The display apparatus of claim 28, wherein the one or more first members and the one or more second members comprise a same material as a material of the one or more first pad parts.

30. The display apparatus of claim 27, wherein the first partition, the second partition, and the third partition comprise a same material.

31. The display apparatus of claim 14, wherein:
the first region is a left region of the display panel;
the second region is a right region of the display panel;
the third region is a center region of the display panel; and
each of an area of the first region and an area of the second region is greater than an area of the third region.

32. The display apparatus of claim 14, wherein:
one of the one or more sound generation devices is in the first region; and
another of the one or more sound generation devices is in the second region.

33. The display apparatus of claim 14, wherein:
each of the one or more sound generation devices is overlapped by a display area of the display panel in a plan view; and
the one or more sound generation devices are configured to vibrate the display panel to generate sound.

34. The display apparatus of claim 14, wherein each of the one or more sound generation devices includes one or more of: a circular shape, an oval shape, and a pair of sound generation devices.

* * * * *